US012660167B2

(12) United States Patent
Seong et al.

(10) Patent No.: US 12,660,167 B2
(45) Date of Patent: Jun. 16, 2026

(54) SEMICONDUCTOR MEMORY DEVICES HAVING CONTACT PLUGS

(71) Applicant: Samsung Electronics Co., Ltd., Suwon-si (KR)

(72) Inventors: Hyejin Seong, Suwon-si (KR); Dongsoo Woo, Seoul (KR); Wonchul Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 20 days.

(21) Appl. No.: 18/592,121

(22) Filed: Feb. 29, 2024

(65) Prior Publication Data

US 2024/0206157 A1 Jun. 20, 2024

Related U.S. Application Data

(63) Continuation of application No. 17/716,194, filed on Apr. 8, 2022, now Pat. No. 11,968,823, which is a
(Continued)

(30) Foreign Application Priority Data

Dec. 18, 2019 (KR) ........................ 10-2019-0170203

(51) Int. Cl.
*H10B 12/00* (2023.01)

(52) U.S. Cl.
CPC ........... *H10B 12/34* (2023.02); *H10B 12/053* (2023.02); *H10B 12/09* (2023.02); *H10B 12/315* (2023.02);
(Continued)

(58) Field of Classification Search
None
See application file for complete search history.

(56) References Cited

U.S. PATENT DOCUMENTS 6,022,810 A 2/2000 Kusumi et al.
8,618,615 B2 12/2013 Kim
(Continued)

FOREIGN PATENT DOCUMENTS

CN 101740545 A 6/2010
CN 102074560 A 5/2011
(Continued)

OTHER PUBLICATIONS

Office Action dated Apr. 25, 2024 for corresponding KR Patent Application No. 10-2019-0170203.
(Continued)

*Primary Examiner* — Steven M Page
(74) *Attorney, Agent, or Firm* — Muir Patent Law, PLLC

(57) ABSTRACT

A semiconductor memory device includes a substrate having a memory cell region where a plurality of active regions are defined; a word line having a stack structure of a lower word line layer and an upper word line layer and extending over the plurality of active regions in a first horizontal direction, and a buried insulation layer on the word line; a bit line structure arranged on the plurality of active regions, extending in a second horizontal direction perpendicular to the first horizontal direction, and having a bit line; and a word line contact plug electrically connected to the lower word line layer by penetrating the buried insulation layer and the upper word line layer and having a plug extension in an upper portion of the word line contact plug, the plug extension having a greater horizontal width than a lower portion of the word line contact plug.

20 Claims, 65 Drawing Sheets

Related U.S. Application Data continuation of application No. 16/993,394, filed on Aug. 14, 2020, now Pat. No. 11,329,050.

(52) U.S. Cl.
CPC ......... *H10B 12/482* (2023.02); *H10B 12/485* (2023.02); *H10B 12/50* (2023.02)

(56) References Cited

U.S. PATENT DOCUMENTS

| | | | |
|---|---|---|---|
| 8,785,213 B2 | 7/2014 | Oh et al. | |
| 9,818,829 B2 | 11/2017 | Lee et al. | |
| 9,978,850 B2 | 5/2018 | Chuang et al. | |
| 2008/0284029 A1 | 11/2008 | Kim et al. | |
| 2010/0117143 A1* | 5/2010 | Lee | H10D 88/00 |
| | | | 257/329 |
| 2012/0012927 A1* | 1/2012 | Uchiyama | H10B 12/482 |
| | | | 257/330 |
| 2012/0070944 A1 | 3/2012 | Kim et al. | |
| 2013/0102150 A1 | 4/2013 | Oh et al. | |
| 2015/0303200 A1 | 10/2015 | Yuki | |
| 2016/0163637 A1 | 6/2016 | Jung et al. | |
| 2016/0181143 A1* | 6/2016 | Kwon | H10B 12/34 |
| | | | 438/586 |
| 2016/0329338 A1* | 11/2016 | Shin | H10B 12/0335 |
| 2018/0254278 A1* | 9/2018 | Nagai | H10B 12/315 |
| 2019/0123196 A1 | 4/2019 | Dix | |
| 2019/0206877 A1 | 7/2019 | Kim et al. | |

FOREIGN PATENT DOCUMENTS

| | | |
|---|---|---|
| CN | 109545772 A | 3/2019 |
| JP | 1994125011 A | 5/1994 |
| JP | 1999145281 A | 5/1999 |
| KR | 1020010005123 A | 1/2001 |
| KR | 100607324 B1 | 8/2006 |
| KR | 1020100008942 U | 1/2010 |
| KR | 1020100052597 A | 5/2010 |
| KR | 1020130023747 A | 3/2013 |
| KR | 1020140073892 A | 6/2014 |
| KR | 1020150124252 A | 11/2015 |

OTHER PUBLICATIONS

Office Action dated Oct. 8, 2024 for corresponding Japanese Patent Application No. 2020-202676.

Office Action dated Jul. 5, 2022, for corresponding De Patent Application No. 102020121161.9.

* cited by examiner

116T

116

110

A                    A'

SEMICONDUCTOR MEMORY DEVICES HAVING CONTACT PLUGS

CROSS-REFERENCE TO RELATED APPLICATION

This application is a continuation of U.S. application Ser. No. 17/716,194, filed Apr. 8, 2022, which is a continuation of U.S. application Ser. No. 16/993,394, filed Aug. 14, 2020, which claims the benefit of priority under 35 U.S.C. § 119 of Korean Patent Application No. 10-2019-0170203, filed on Dec. 18, 2019, in the Korean Intellectual Property Office, the entire disclosures of all of which are incorporated herein by reference.

BACKGROUND

The inventive concept relates to semiconductor memory devices, and more particularly, to a semiconductor memory device having contact plugs.

With rapid developments in the electronic industry and demands of users, electronic devices are becoming more compact and lighter. Accordingly, semiconductor memory devices used in electronic devices are typically needed to have a high degree of integration, and thus design rules for the components of semiconductor memory devices have been decreased. Therefore, it is difficult to secure the reliability of electrical connection between the components of semiconductor memory devices.

SUMMARY

The inventive concept provides a semiconductor memory device having contact plugs capable of providing a reliable electrical connection.

According to an aspect of the inventive concept, there is provided a semiconductor memory device. A semiconductor memory device includes a substrate having a memory cell region where a plurality of active regions are defined, and a peripheral circuit region where at least one logic active region is defined; a word line having a stack structure of a lower word line layer and an upper word line layer and extending over the plurality of active regions in a first horizontal direction, and a buried insulation layer on the word line; a bit line structure arranged on the plurality of active regions, extending in a second horizontal direction perpendicular to the first horizontal direction, and having a bit line; and a word line contact plug electrically connected to the lower word line layer by penetrating the buried insulation layer and the upper word line layer and having a plug extension in an upper portion of the word line contact plug, the plug extension having a greater horizontal width than a lower portion of the word line contact plug, wherein a lateral surface of the word line contact plug between a top surface and a bottom surface of the upper word line layer is entirely surrounded by the upper word line layer.

A semiconductor memory device includes a substrate having a memory cell region where a plurality of active regions are defined, and a peripheral circuit region where at least one logic active region is defined; a word line having a stack structure of a lower word line layer and an upper word line layer and extending over the plurality of active regions in a first horizontal direction, and a buried insulation layer on the word line; a bit line structure arranged on the plurality of active regions, extending in a second horizontal direction perpendicular to the first horizontal direction, and having a bit line; and a word line contact plug electrically connected to the lower word line layer by penetrating the buried insulation layer and the upper word line layer and having a plug extension in an upper portion of the word line contact plug, the plug extension having a greater horizontal width than a lower portion of the word line contact plug, wherein a lateral surface of the word line contact plug between a top surface and a bottom surface of the upper word line layer is entirely surrounded by the upper word line layer.

A semiconductor memory device includes a substrate having a memory cell region where a plurality of active regions are defined, and a peripheral circuit region where at least one logic active region is defined; a plurality of word lines that fill a plurality of word line trenches each extending in a first horizontal direction over the plurality of active regions to be parallel to each other and each have a stack structure of a lower word line layer and an upper word line layer, and a plurality of buried insulation layers on the plurality of word lines; a plurality of bit line structures arranged on the plurality of active regions, each extending in a second horizontal direction perpendicular to the first horizontal direction to be parallel to each other, and each having a bit line and an insulation capping line covering the bit line; a filling insulation layer that fills a space between the plurality of bit line structures; a word line contact plug having a plug extension in an upper portion of the word line contact plug, the plug extension having a greater horizontal width than a lower portion of the word line contact plug, being connected to the lower word line layer by penetrating the filling insulation layer, the buried insulation layer, and the upper word line layer, and having a lateral surface at a level between a top surface and a bottom surface of the upper word line layer that is entirely covered by the upper word line layer; a plurality of buried contacts that fills a lower portion of a space between the plurality of bit line structures and is connected to the plurality of active regions; and a plurality of landing pads filling an upper portion of the space between the plurality of bit line structures, extending over the plurality of bit line structures, and including the same material as a material included in the word line contact plug.

BRIEF DESCRIPTION OF THE DRAWINGS

Exemplary embodiments of the inventive concept will be more clearly understood from the following detailed description taken in conjunction with the accompanying drawings in which like numbers refer to like elements throughout. In the drawings.

DETAILED DESCRIPTION OF THE EMBODIMENTS

Figure 1:
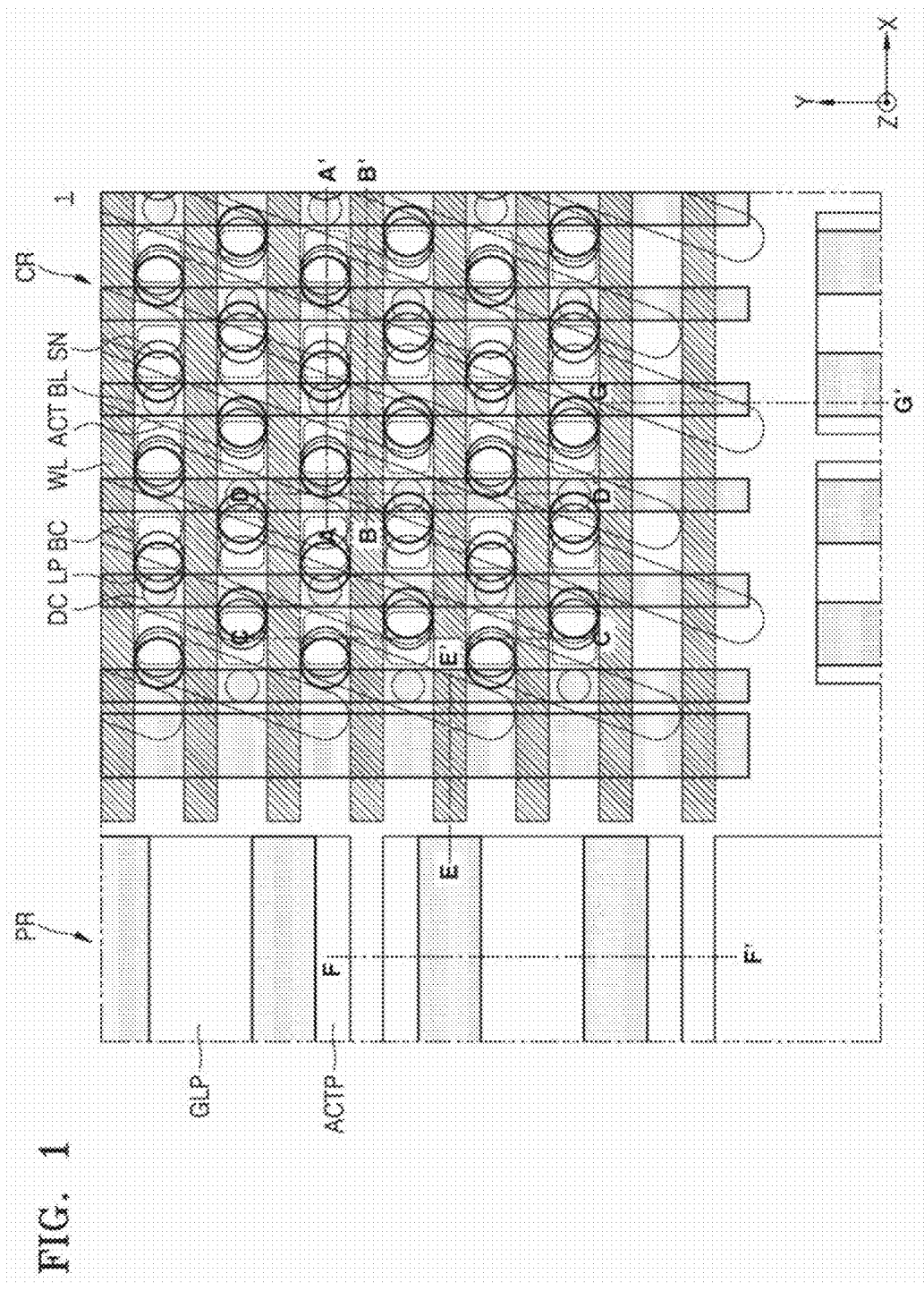
FIG. 1 is a schematic planar layout for explaining main components of a semiconductor memory device, according to example embodiments of the inventive concept.

FIG. 1 is a schematic planar layout for explaining main components of a semiconductor memory device, according to example embodiments of the inventive concept.

Referring to FIG. 1, a semiconductor memory device 1 may include a memory cell region CR and a peripheral circuit region PR. The semiconductor memory device 1 may include a plurality of active regions ACT in the memory cell region CR, and a plurality of logic active regions ACTP in the peripheral circuit region PR.

According to some embodiments, the plurality of active regions ACT in the memory cell region CR may be arranged to have a long axis in a diagonal direction to a first horizontal direction (X direction) and a second horizontal direction (Y direction).

A plurality of word lines WL may each extend lengthwise in the X direction across the plurality of active regions ACT to be parallel to each other in the memory cell region CR. A plurality of bit lines BL may each extend lengthwise above the plurality of word lines WL in the second horizontal direction (Y direction) intersecting the first horizontal direction (X direction) to be parallel to each other. The plurality of bit lines BL may be connected to the plurality of active regions ACT via direct contacts DC.

According to some embodiments, a plurality of buried contacts BC may be formed between two adjacent bit lines BL adjacent to each other among the plurality of bit lines BL. According to some embodiments, the plurality of buried contacts BC may be arranged in lines in the first horizontal direction (X direction) and the second horizontal direction (Y direction).

A plurality of landing pads LP may be formed on the plurality of buried contacts BC. The plurality of landing pads LP may be arranged to at least partially overlap the plurality of buried contacts BC in the vertical direction (Z direction). In some embodiments, each of the plurality of landing pads LP may extend to above one of two bit lines BL adjacent thereto.

A plurality of storage nodes SN may be formed above the plurality of landing pads LP. The plurality of storage nodes SN may be formed above the plurality of bit lines BL. The plurality of storage nodes SN may be respective lower electrodes of a plurality of capacitors, respectively. The plurality of storage nodes SN may be connected to the plurality of active regions ACT through the plurality of landing pads LP and the plurality of buried contacts BC.

A plurality of gate line patterns GLP may be arranged on the plurality of logic active regions ACTP in the peripheral circuit region PR. According to some embodiments, some of the plurality of gate line patterns GLP may each extend lengthwise in the first horizontal direction (X direction) on logic active regions ACTP to be parallel with each other, and the remaining ones of the plurality of gate line patterns GLP may each extend lengthwise in the second horizontal direction (Y direction) on the logic active region ACTP to be parallel with each other. However, embodiments are not limited thereto. For example, each of the plurality of gate line patterns GLP may have various widths or may have a curve or may extend in various horizontal directions with a variable width.

Figure 2A:
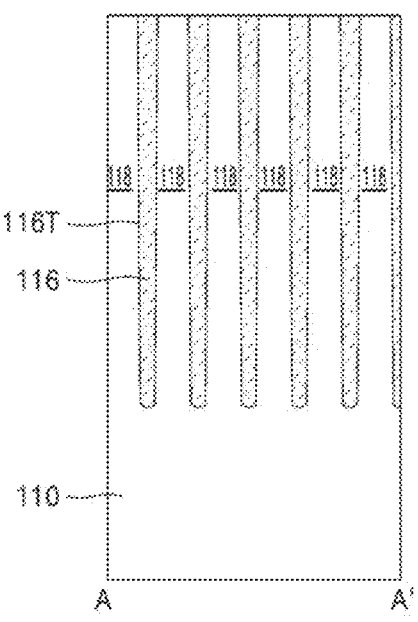
FIGS. 2A to 2G, 3A to 3G, 4A to 4G, 5A to 5G, 6A to 6G, 7A to 7G, 8A to 8G, and 9A to 9G are cross-sectional views showing stages in a method of manufacturing a semiconductor memory device, according to example embodiments of the inventive concept.
Figure 2A:
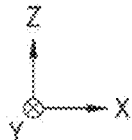
Figure 2B:
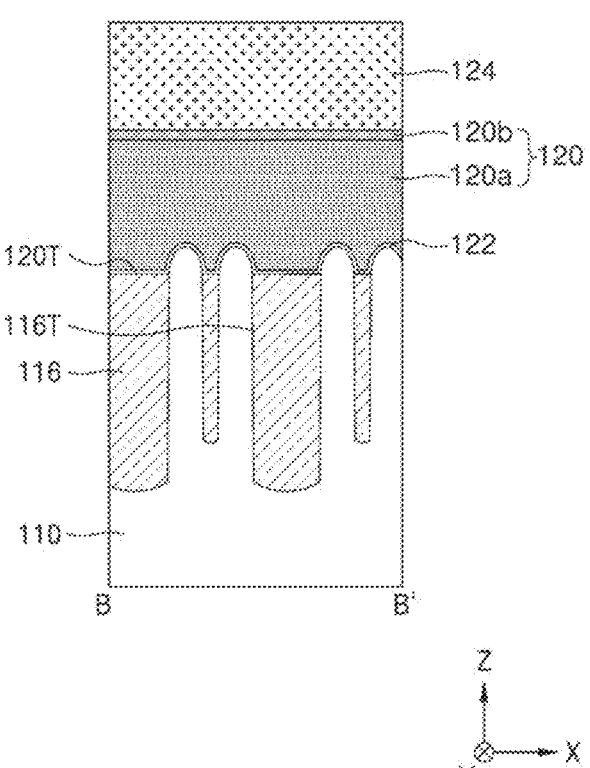
Figure 2C:
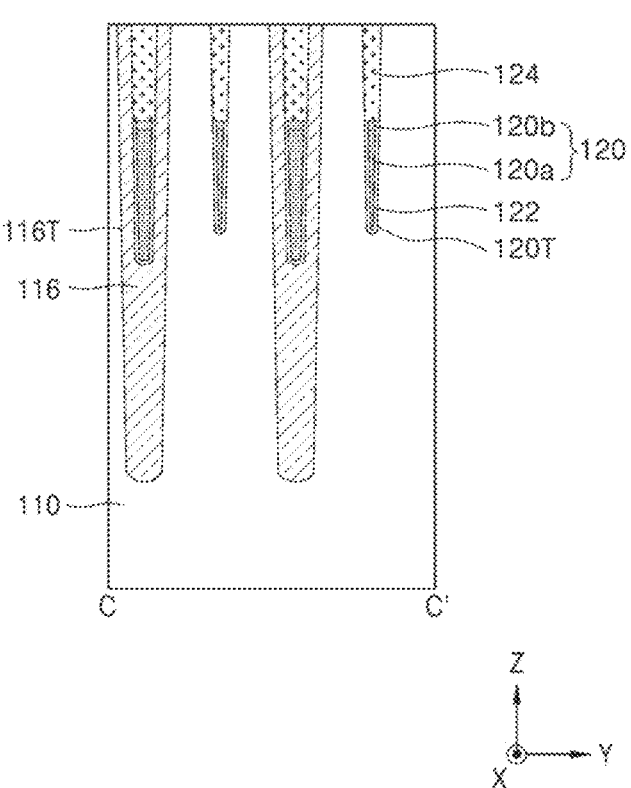
Figure 2D:
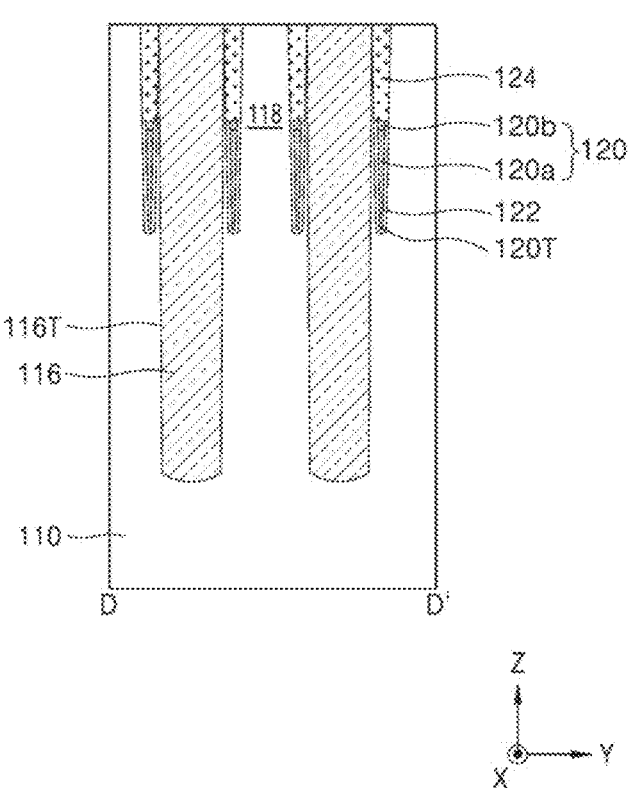
Figure 2E:
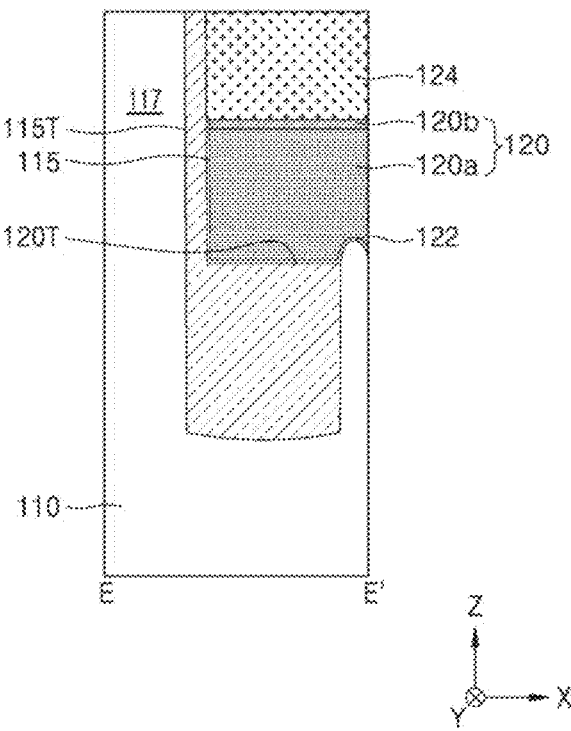
Figure 2F:
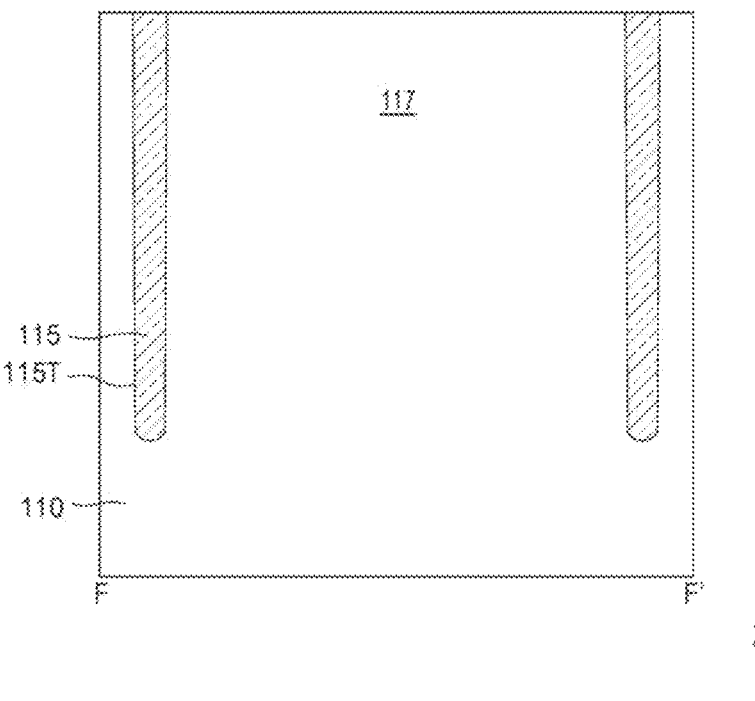
Figure 2G:
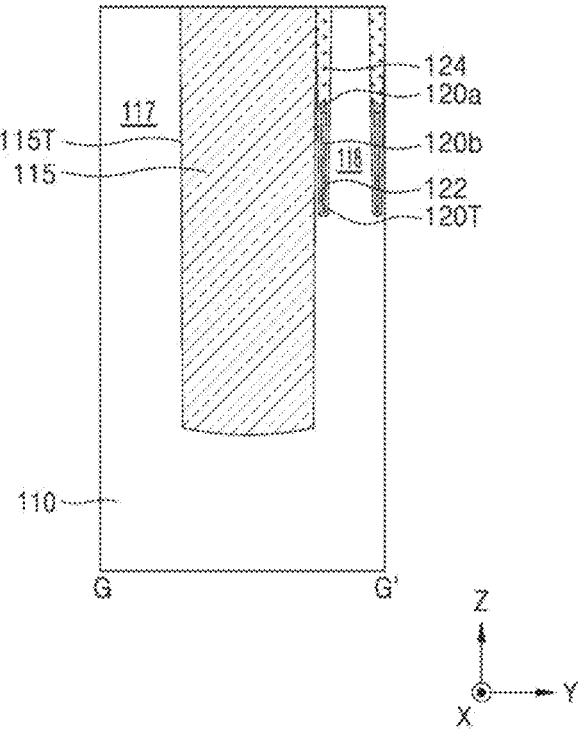
Figure 3A:
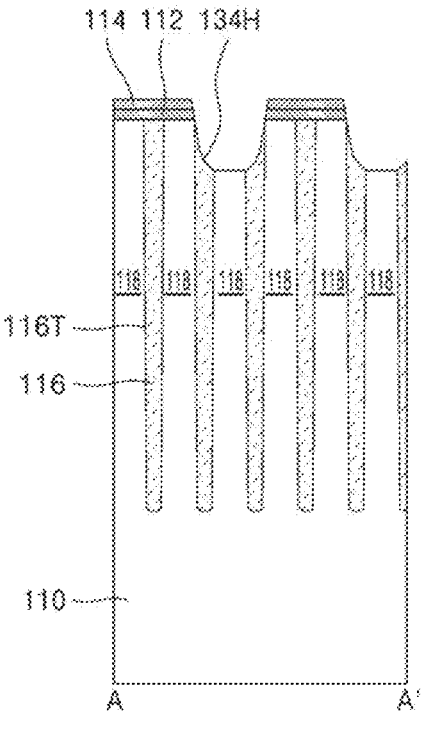
Figure 3A:
Figure 3B:
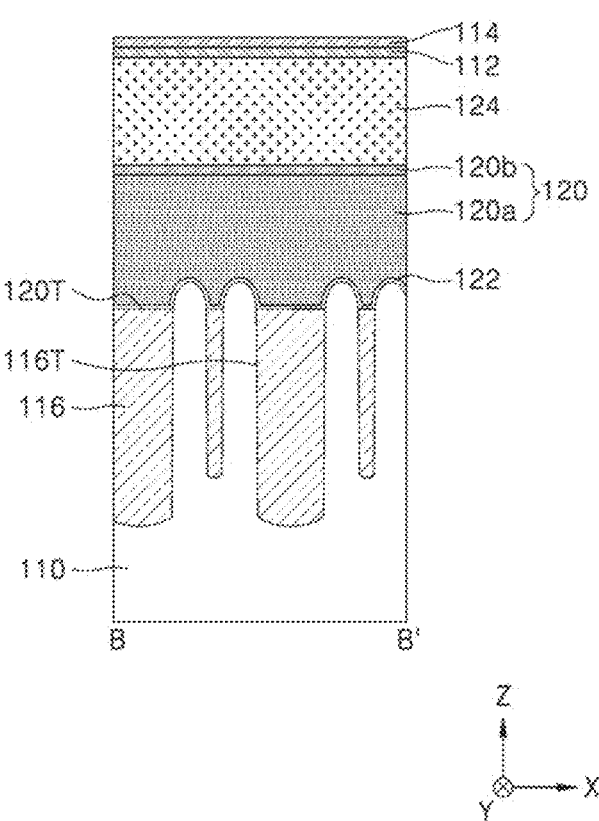
Figure 3C:
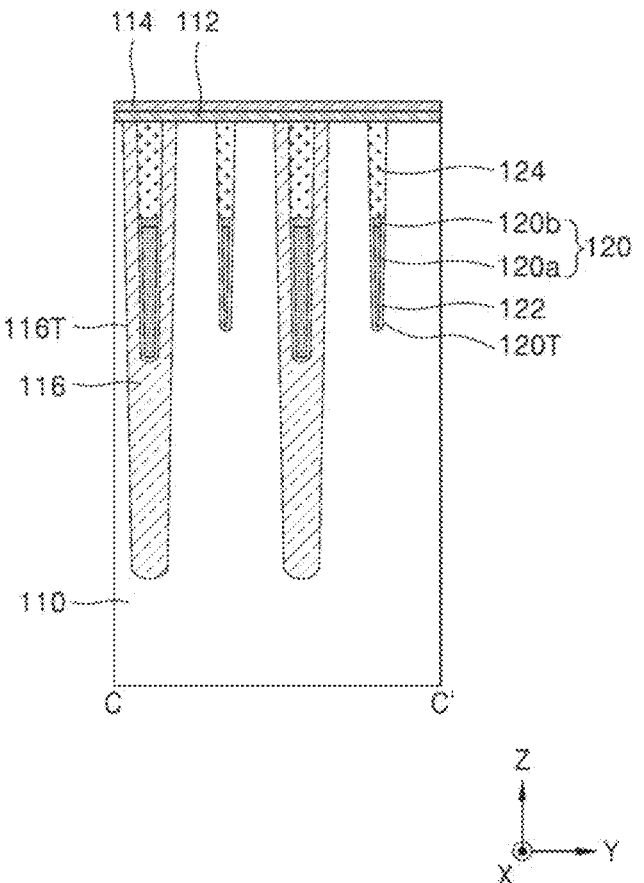
Figure 3D:
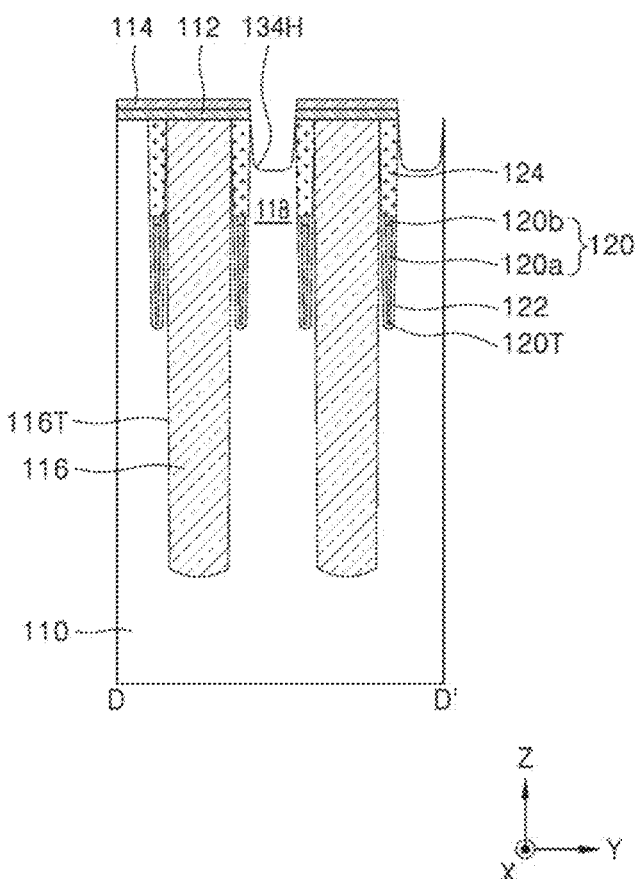
Figure 3E:
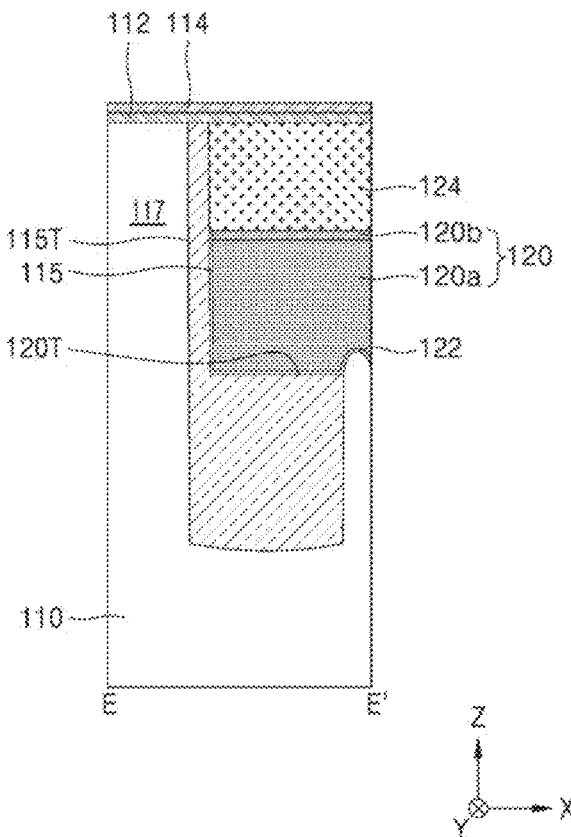
Figure 3F:
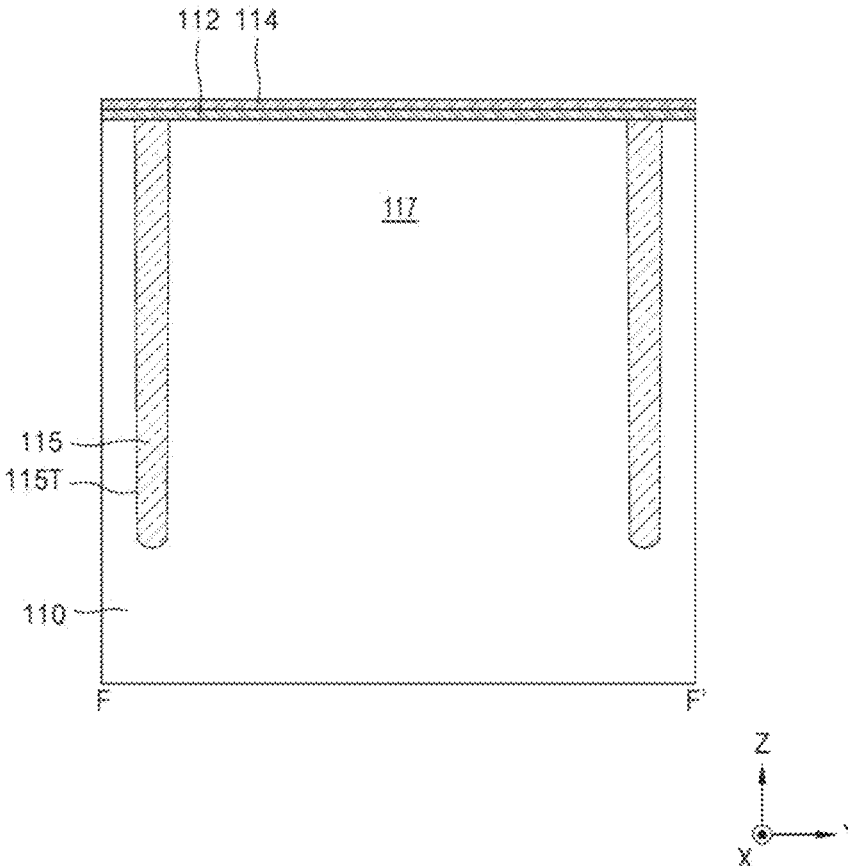
Figure 3G:
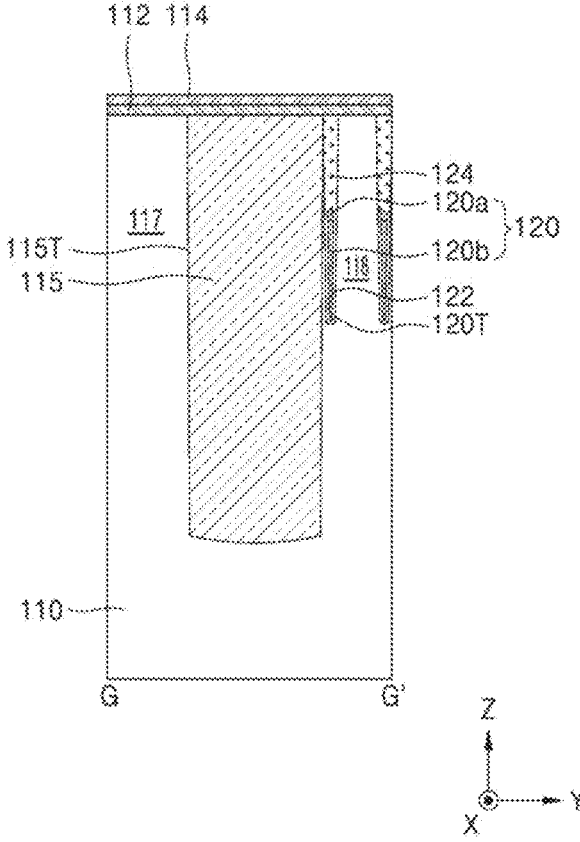
Figure 4A:
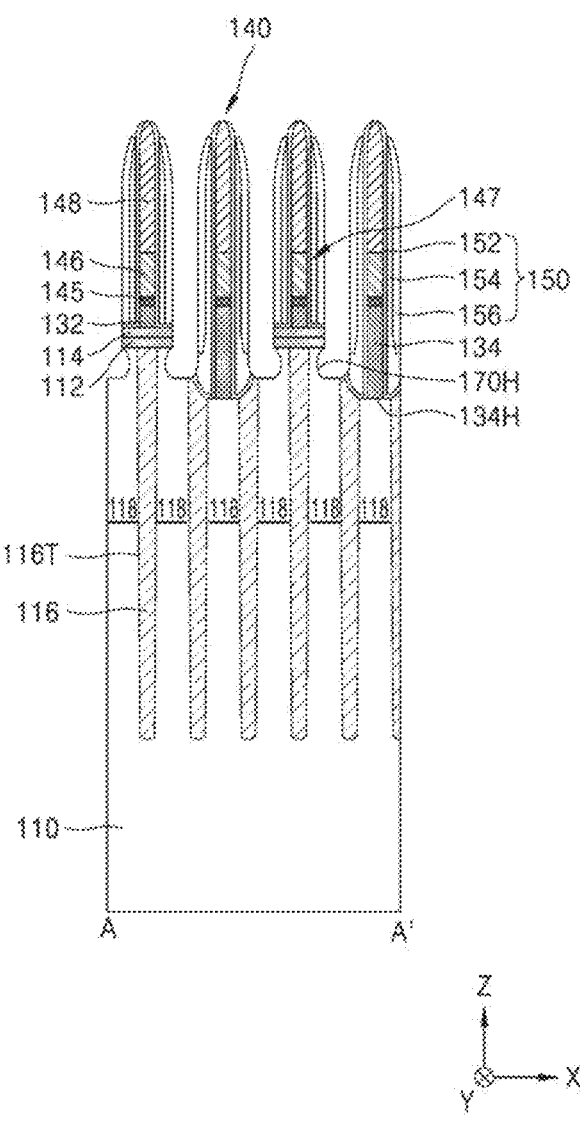
Figure 4B:
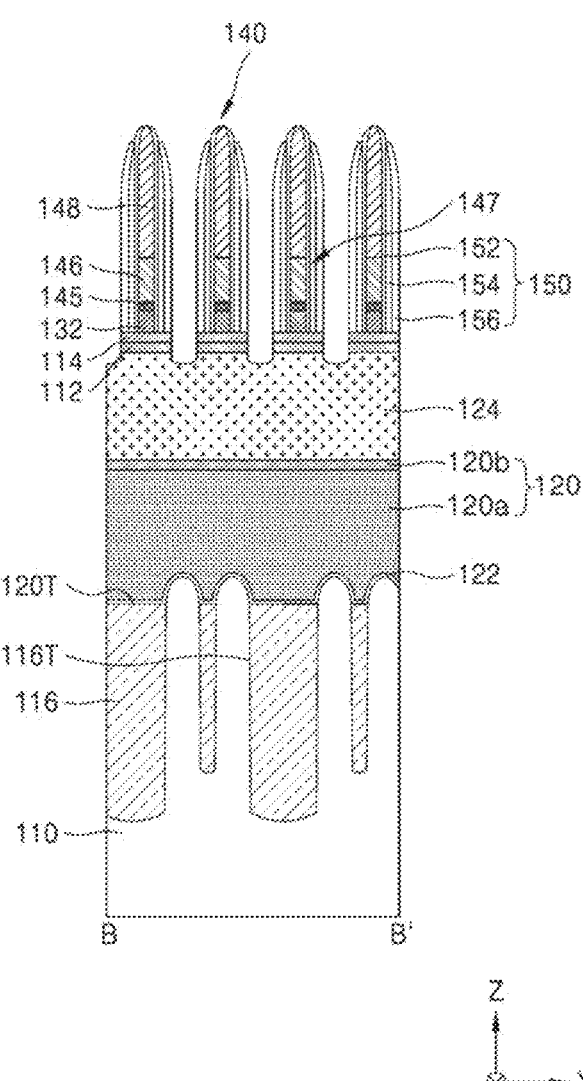
Figure 4C:
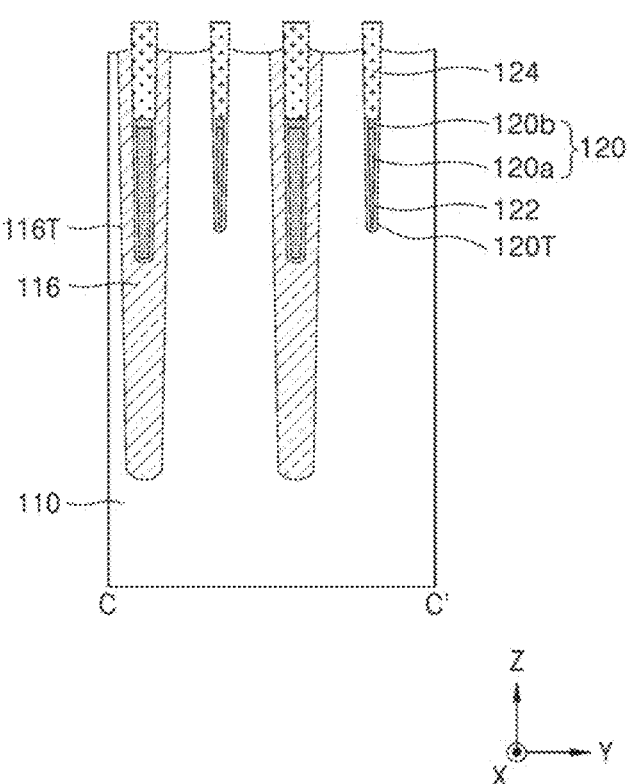
Figure 4D:
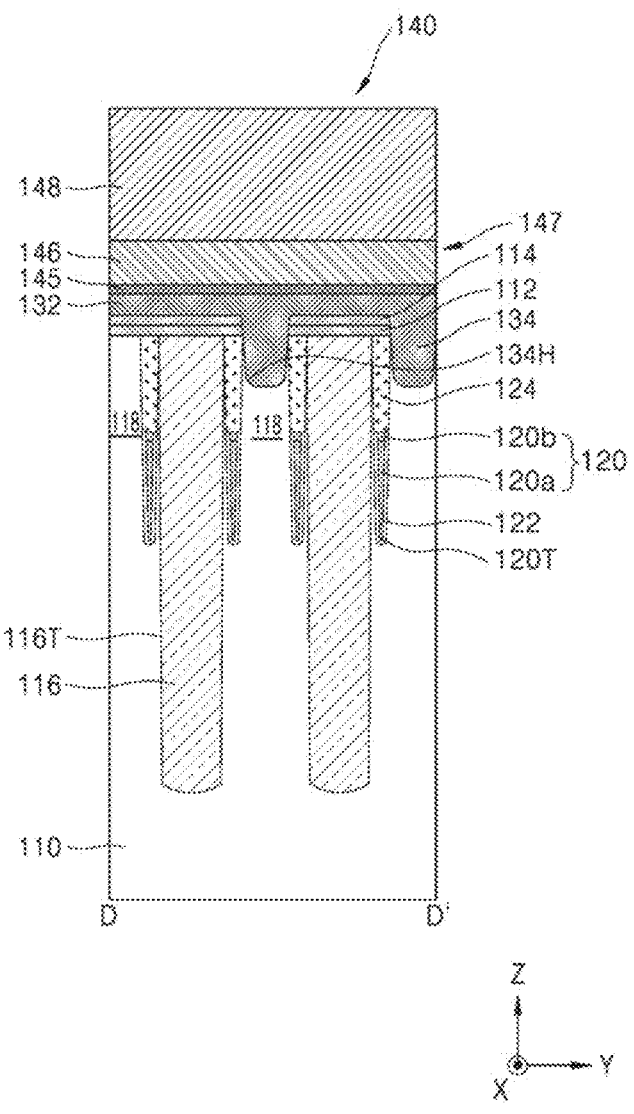
Figure 4E:
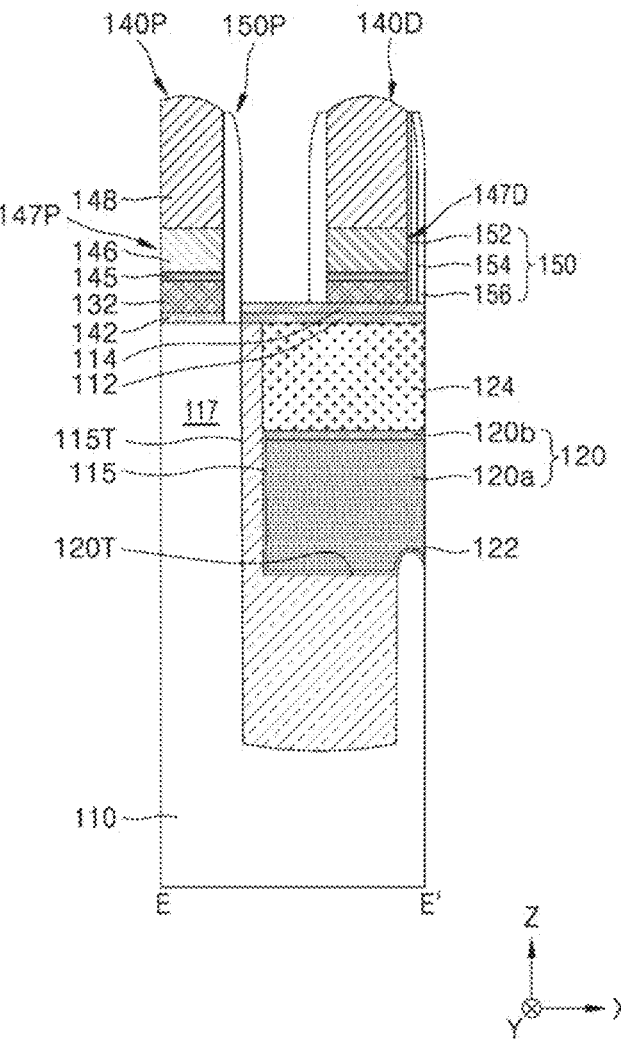
Figure 4F:
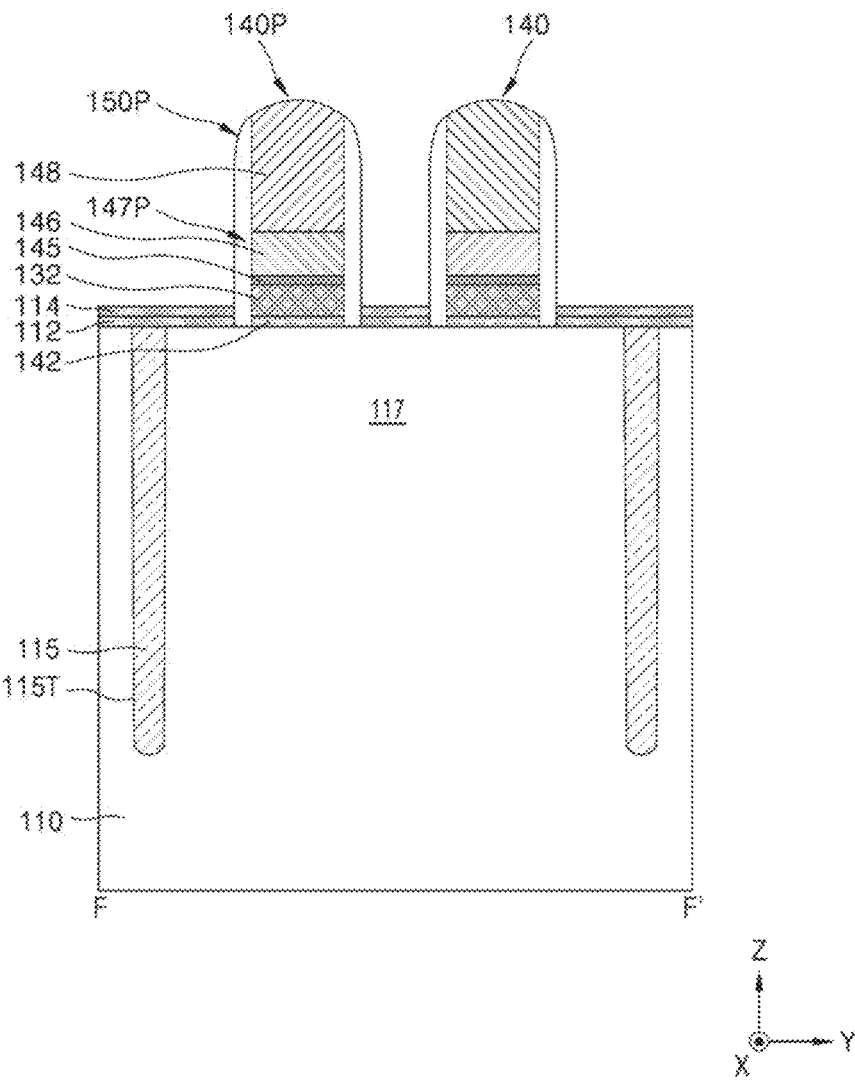
Figure 4G:
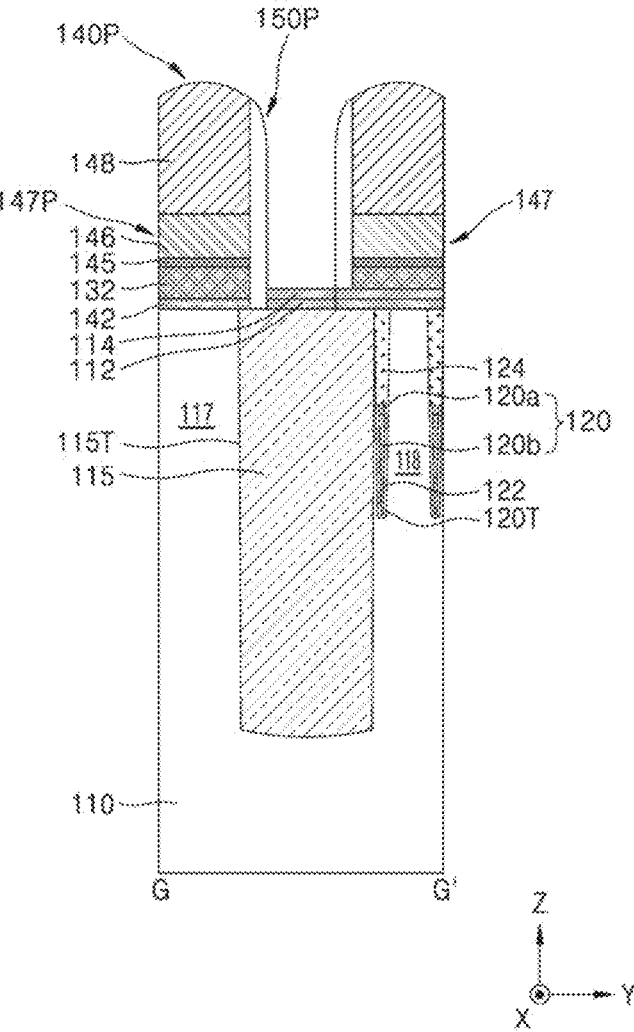
Figure 5A:
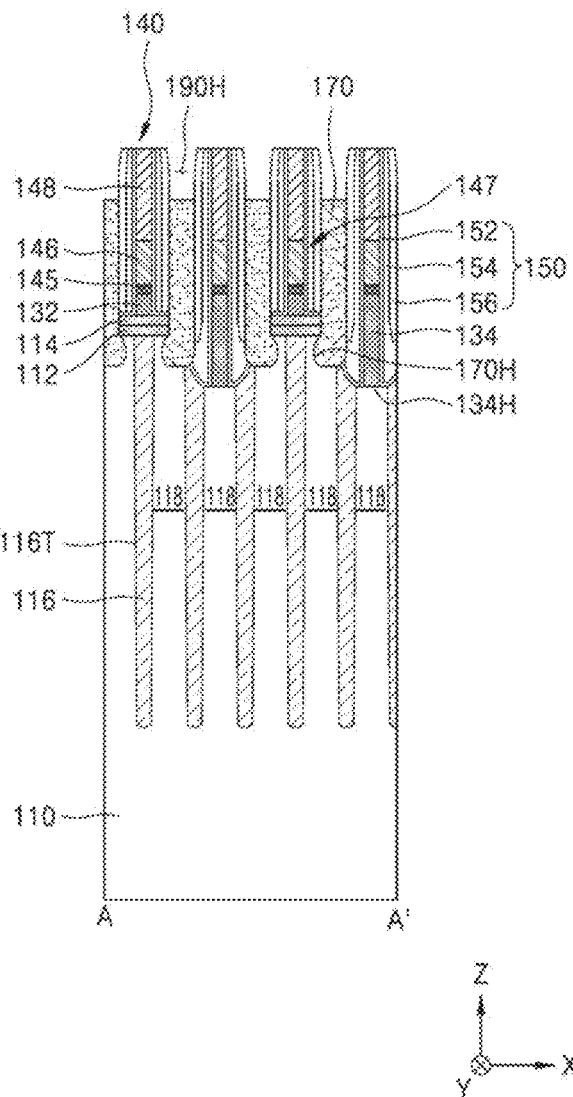
Figure 5B:
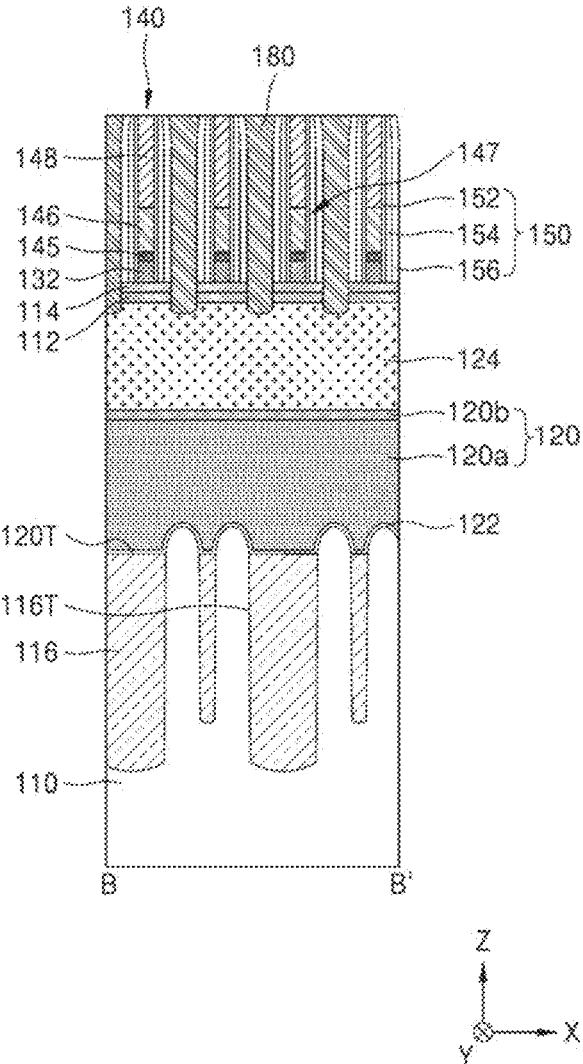
Figure 5C:
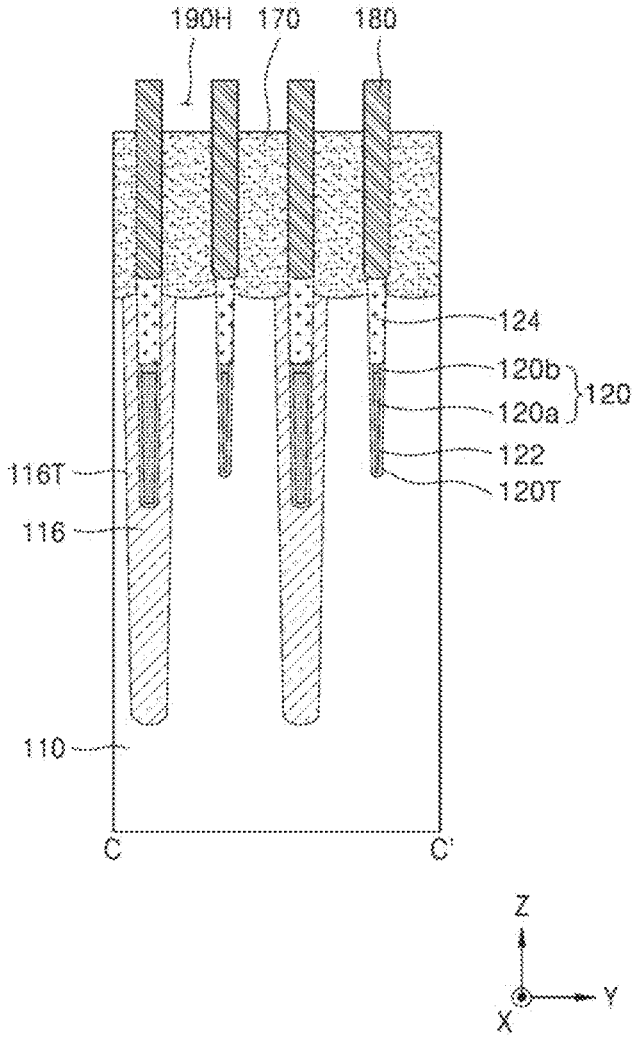
Figure 5D:
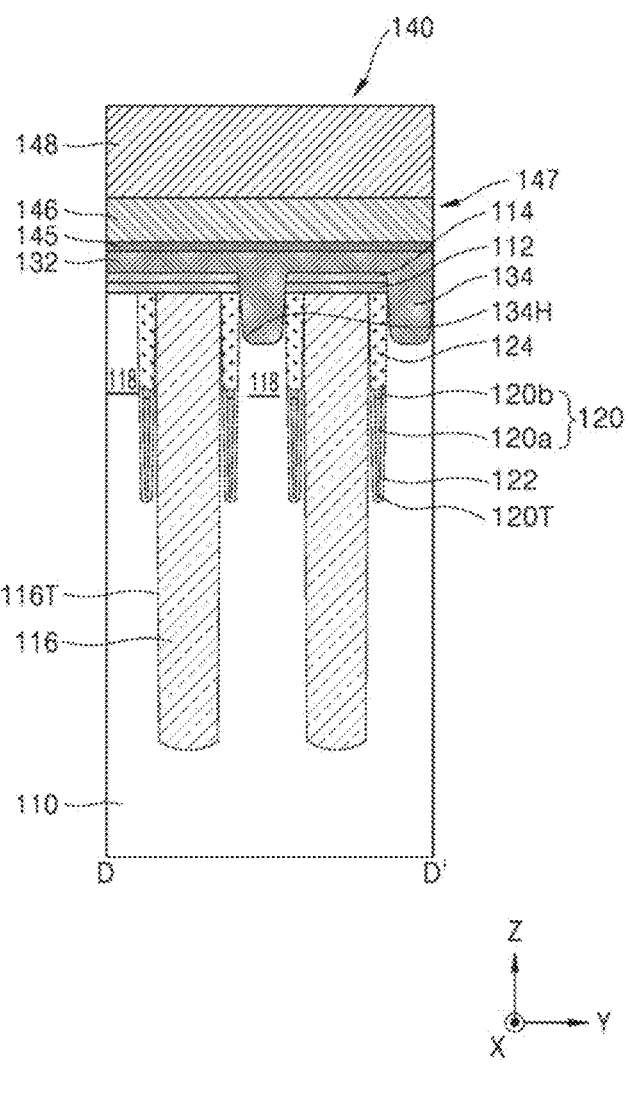
Figure 5E:
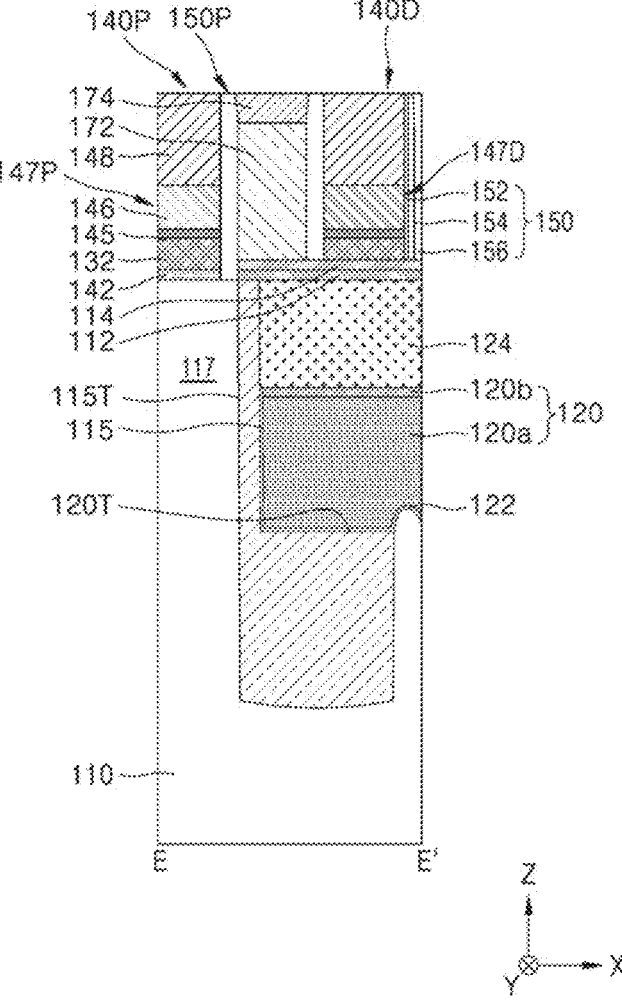
Figure 5F:
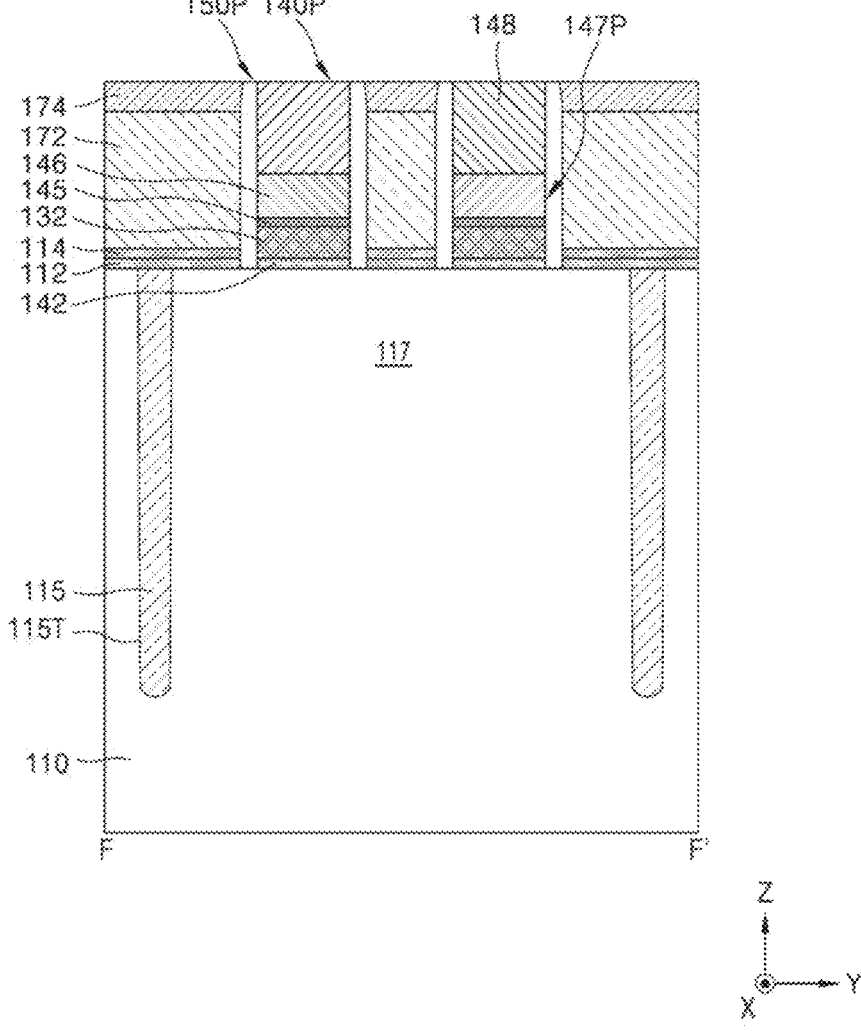
Figure 5G:
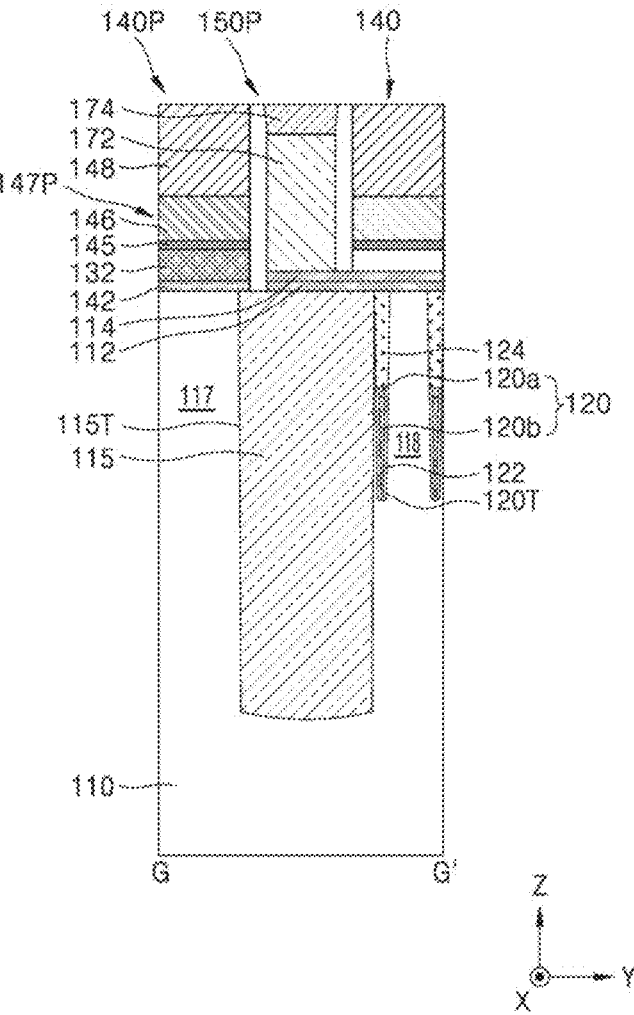
Figure 6A:
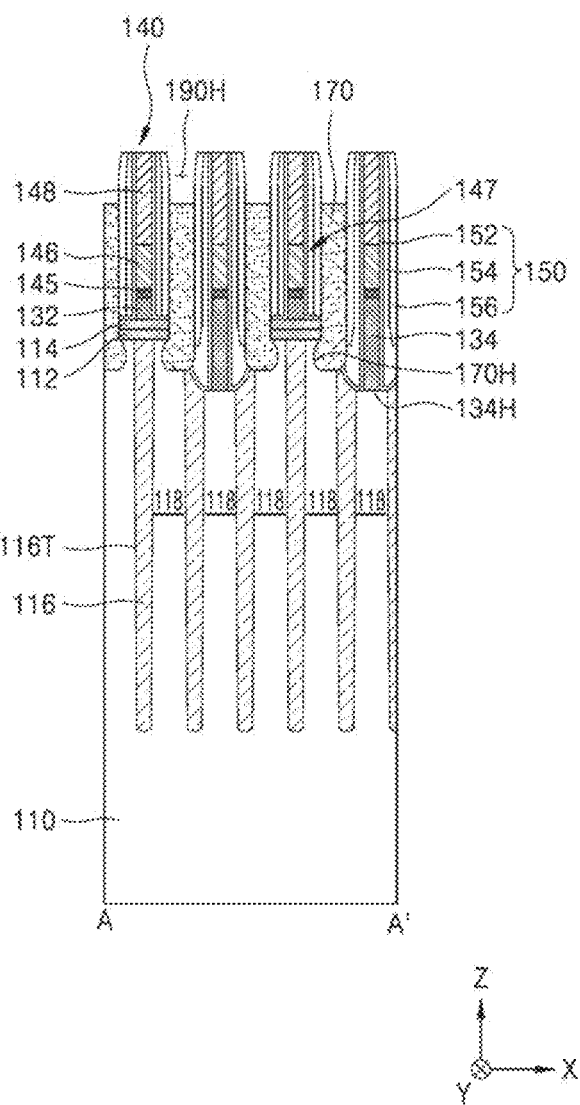
Figure 6B:
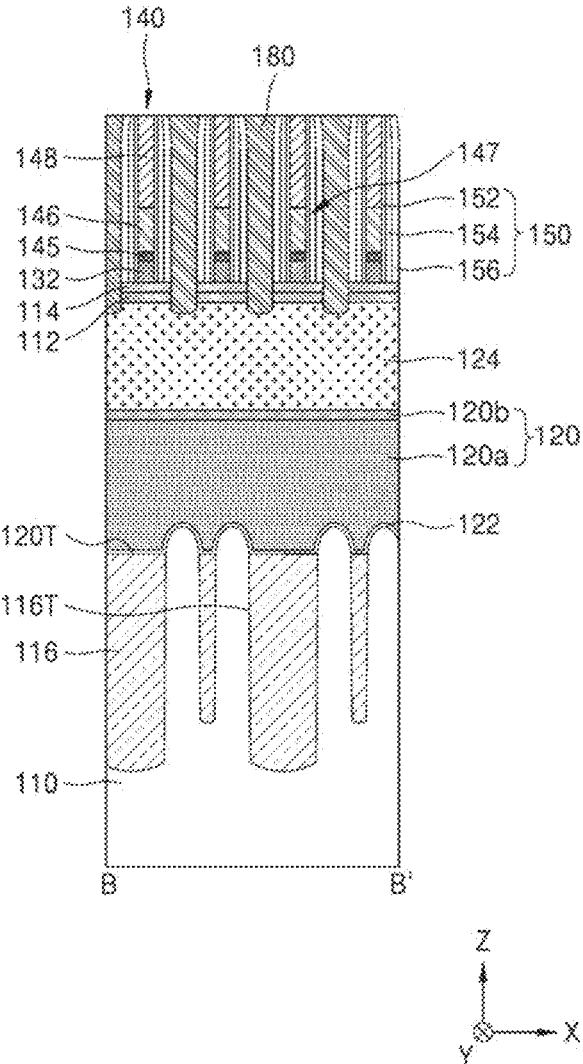
Figure 6C:
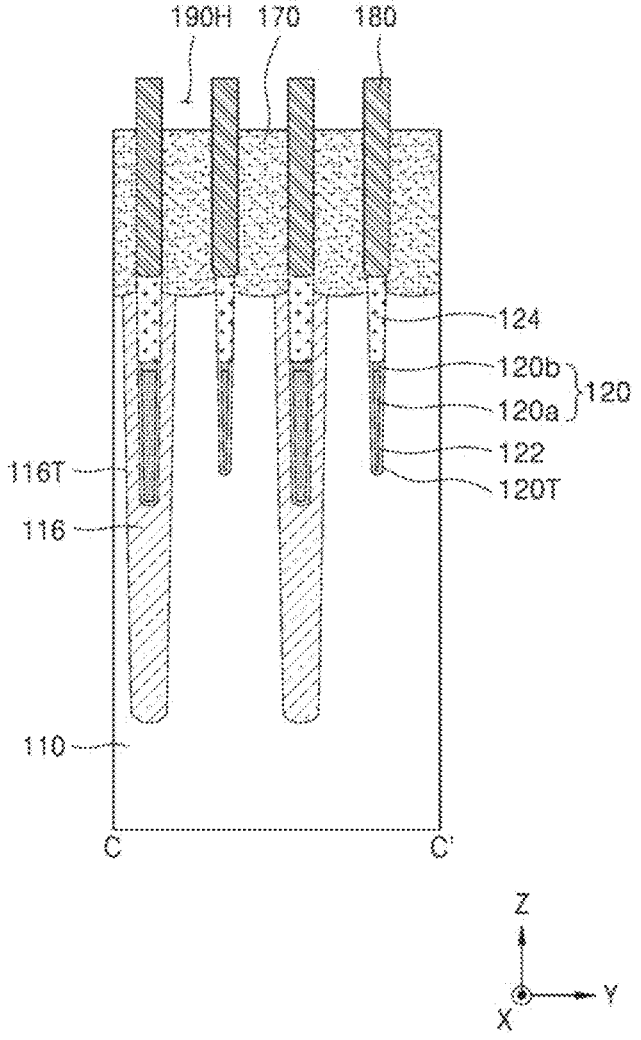
Figure 6D:
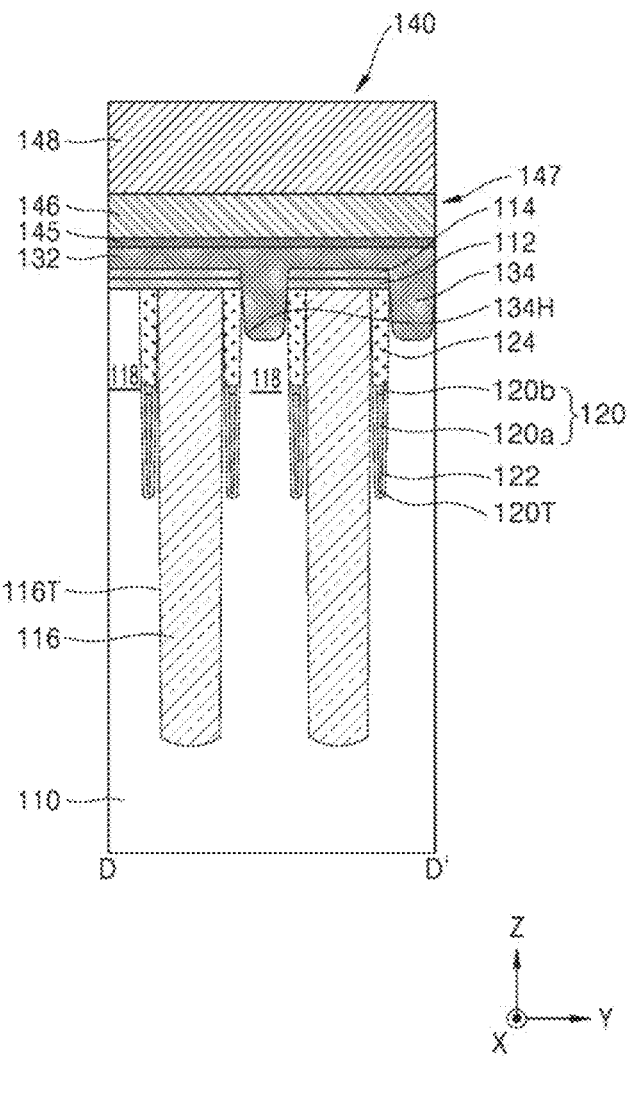
Figure 6E:
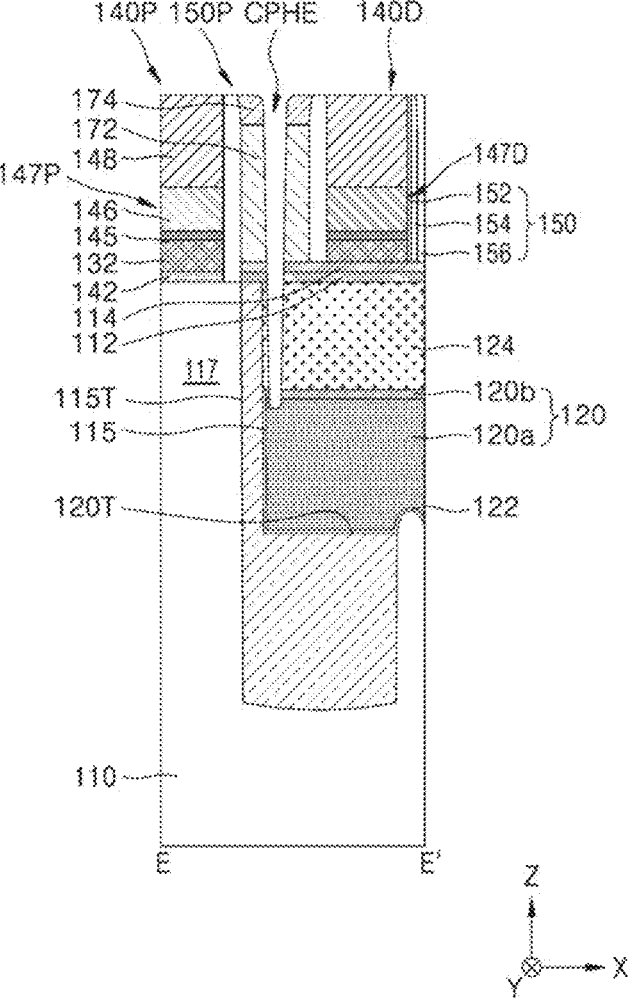
Figure 6F:
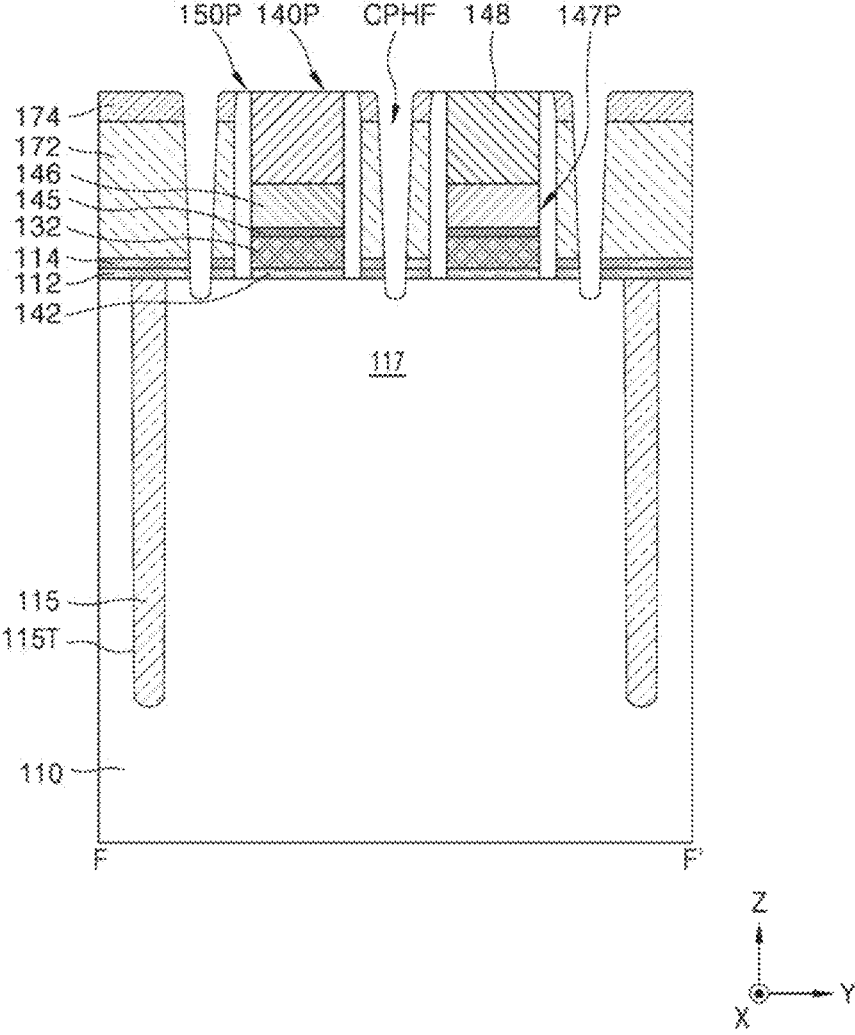
Figure 6G:
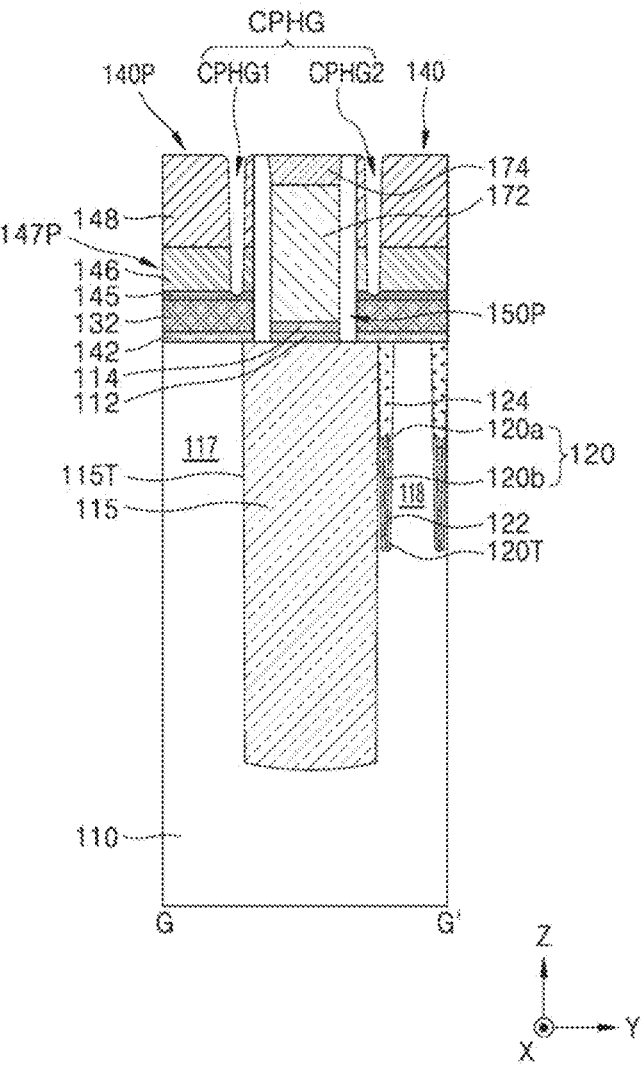
Figure 7A:
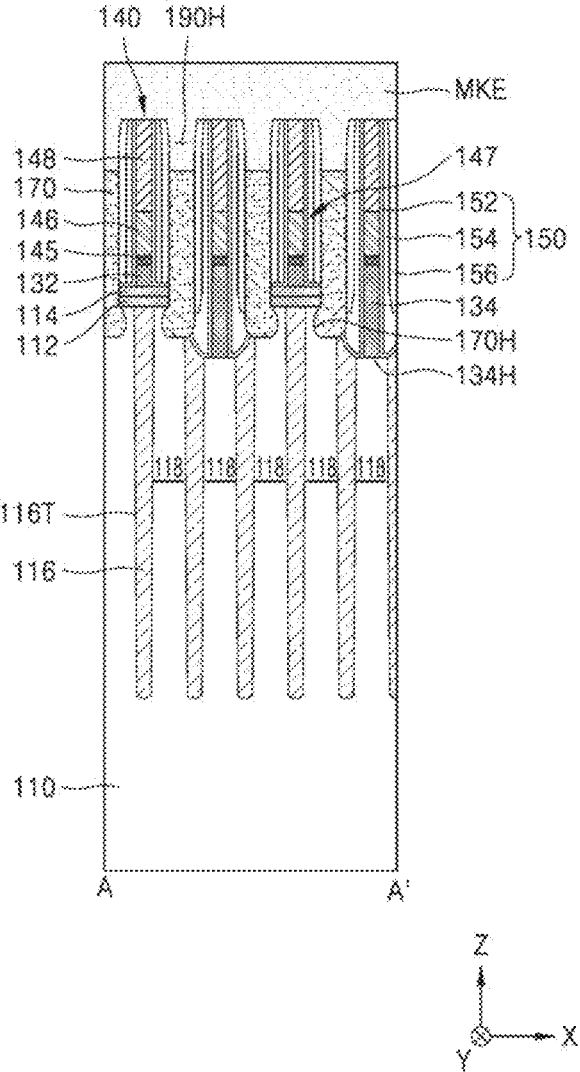
Figure 7B:
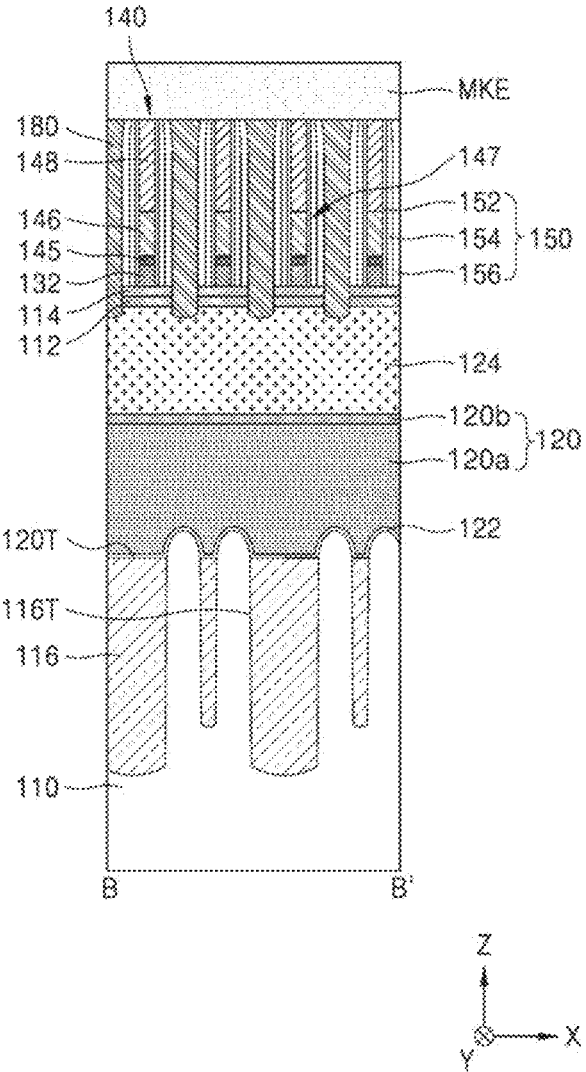
Figure 7C:
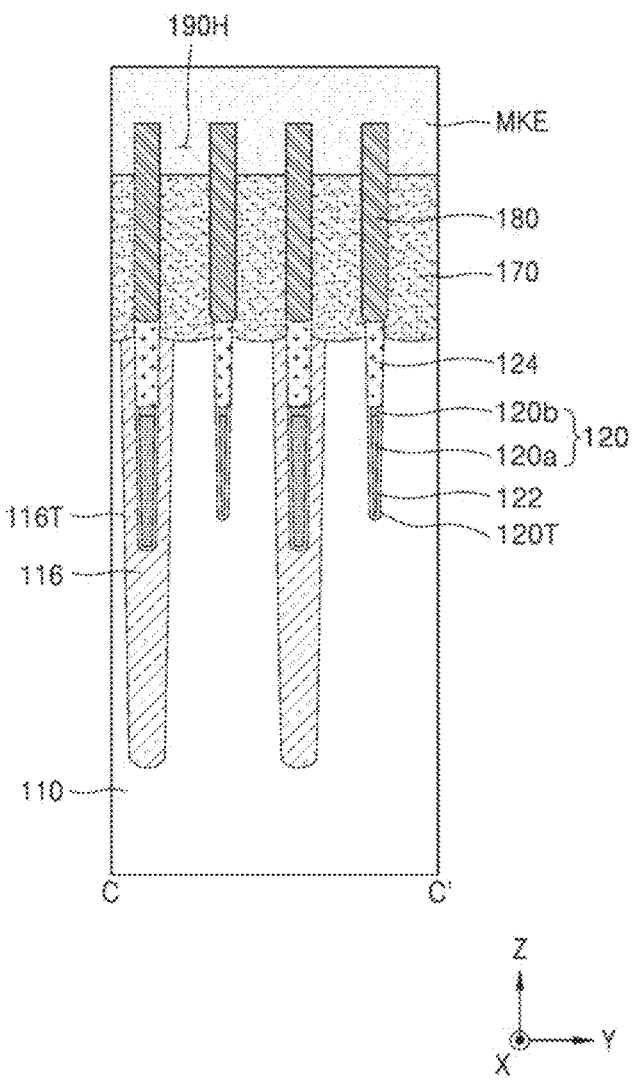
Figure 7D:
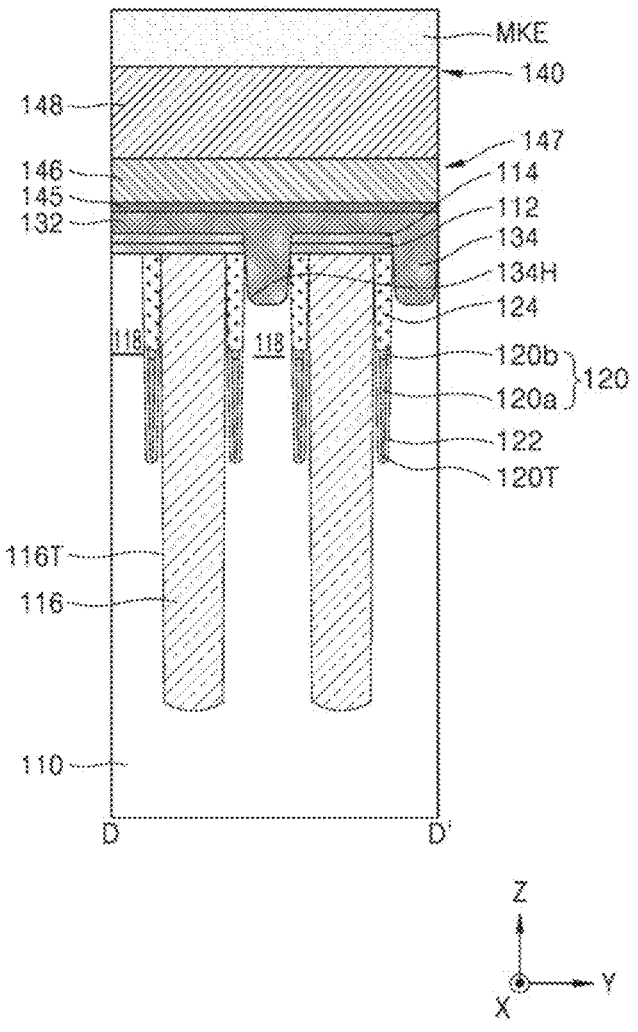
Figure 7E:
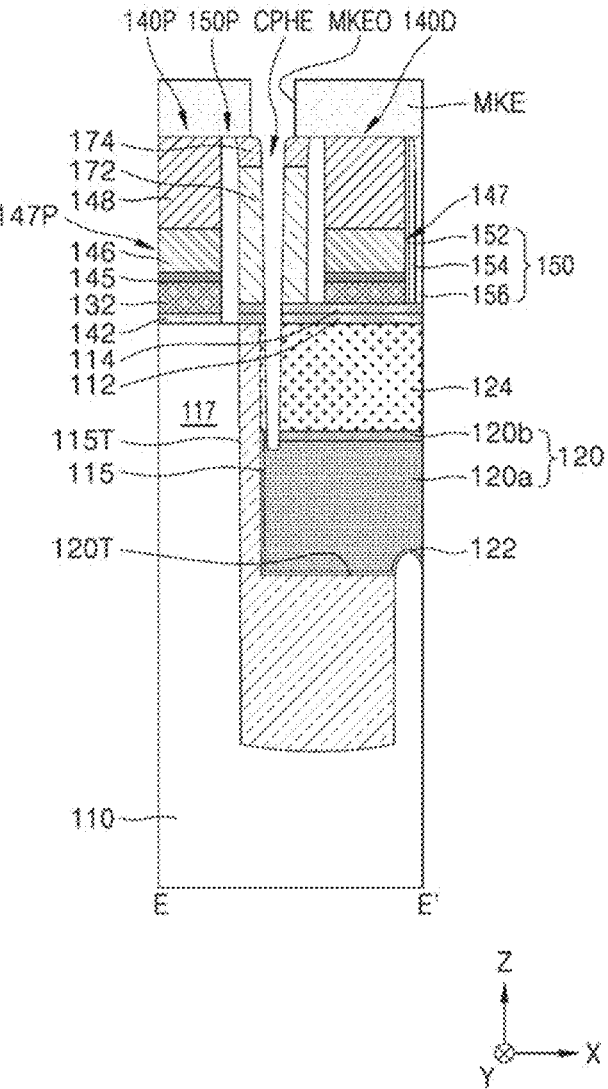
Figure 7F:
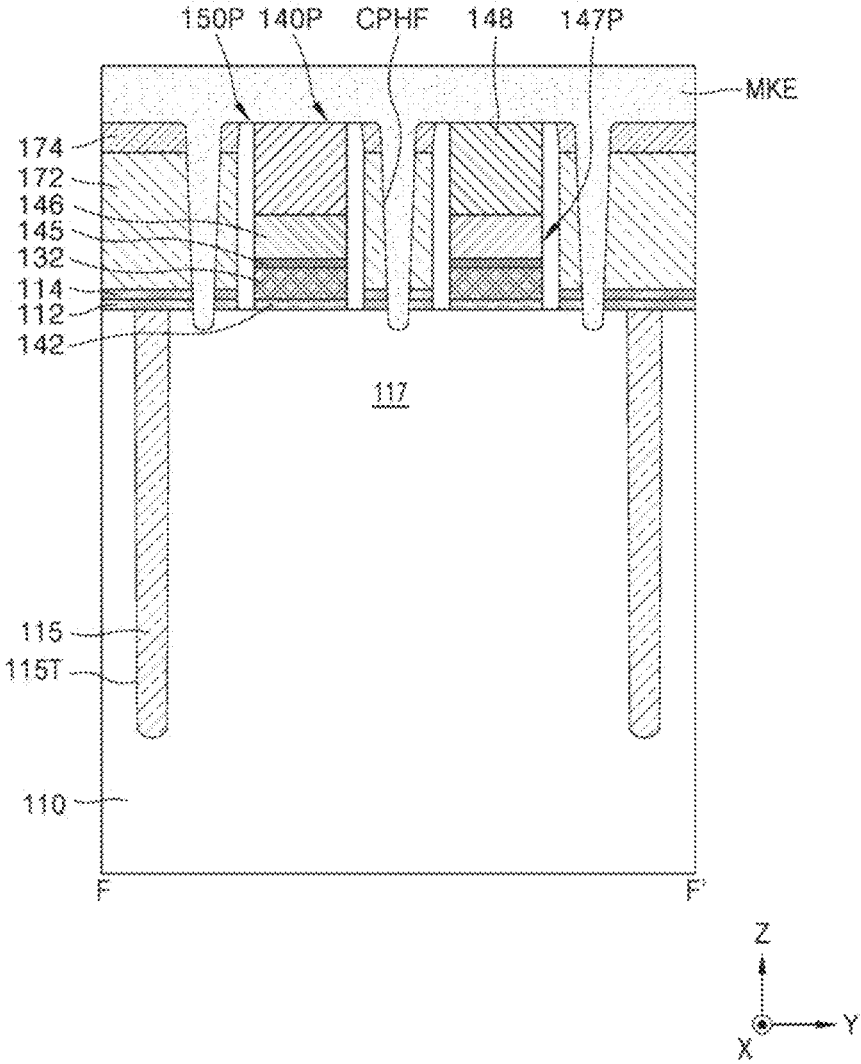
Figure 7G:
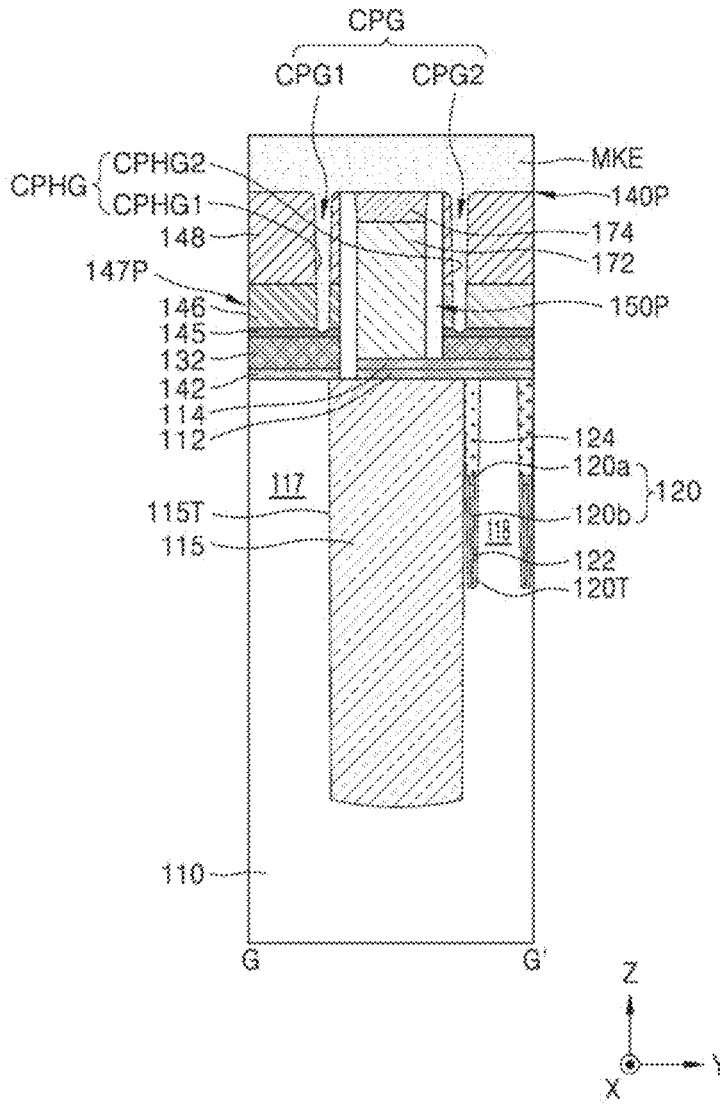
Figure 8A:
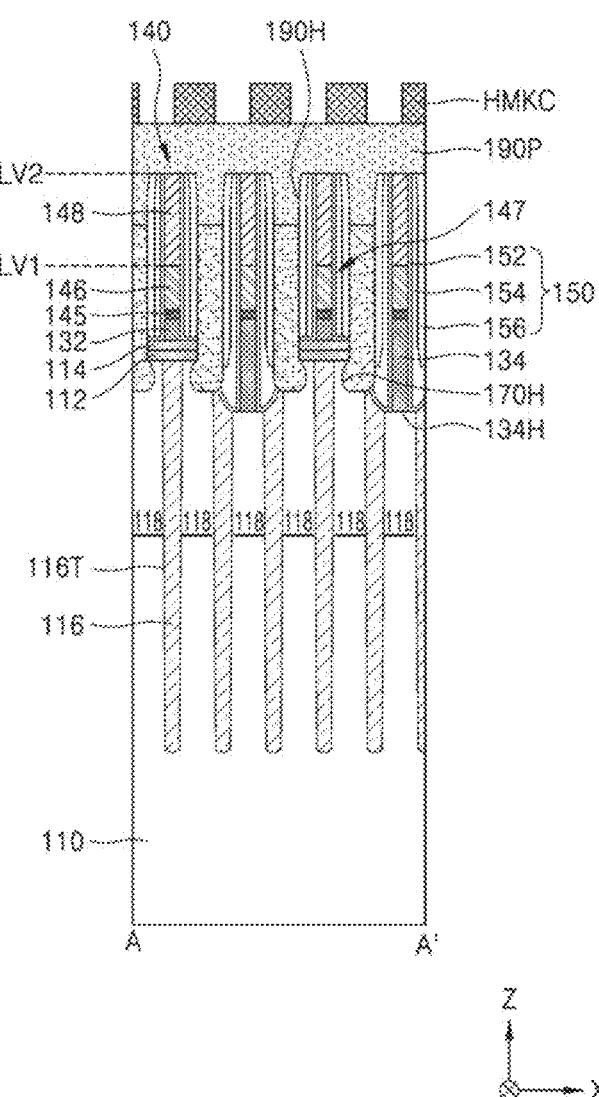
Figure 8B:
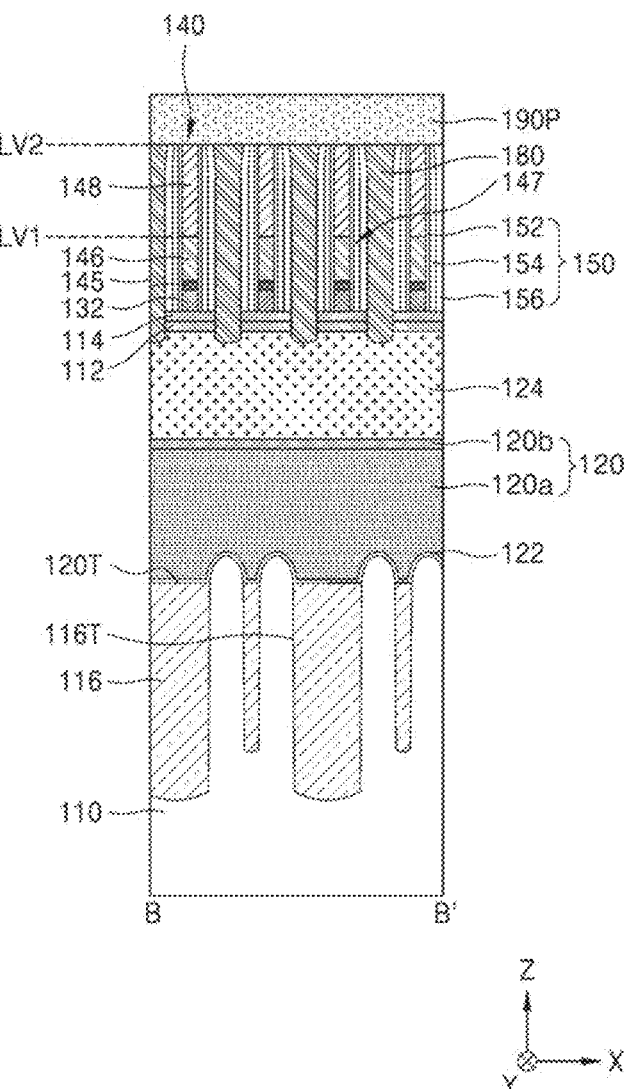
Figure 8C:
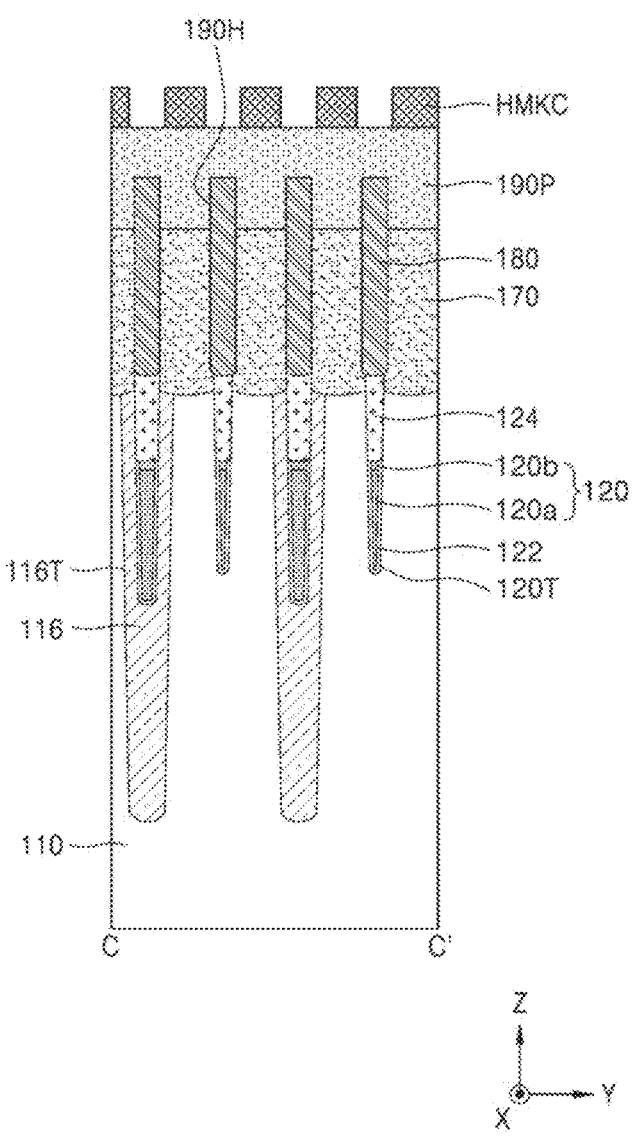
Figure 8D:
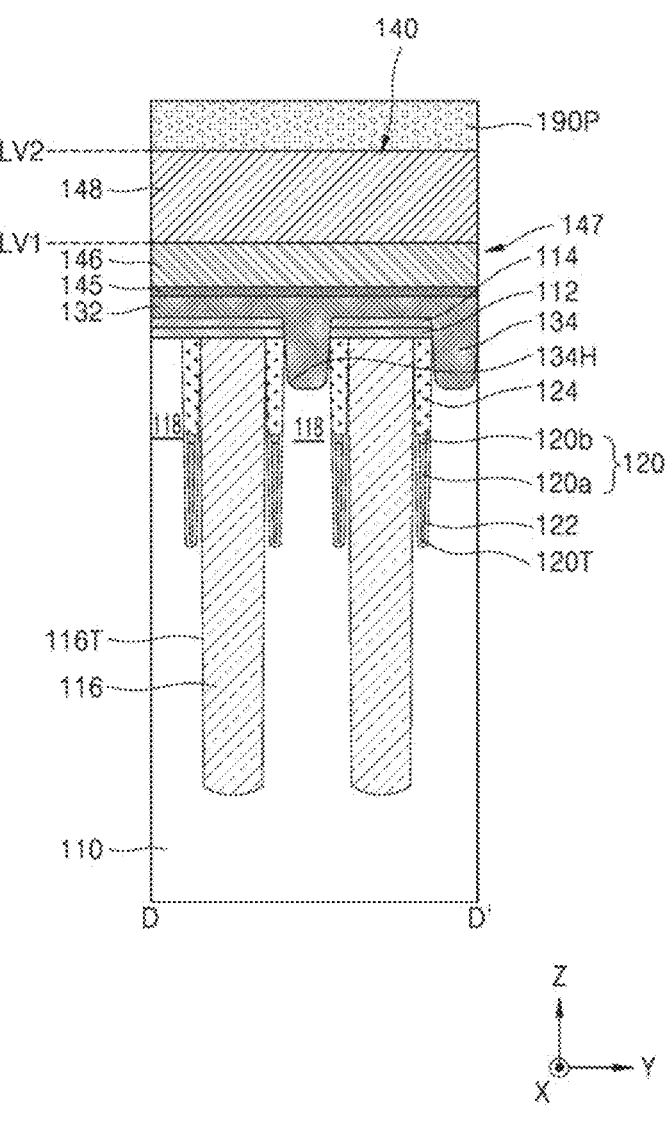
Figure 8E:
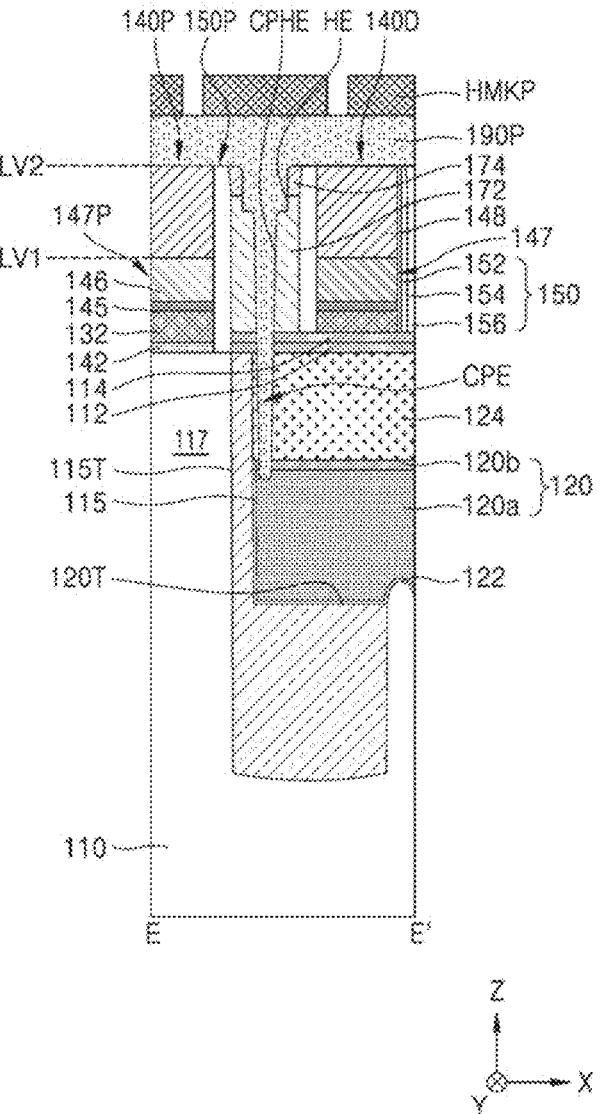
Figure 8F:
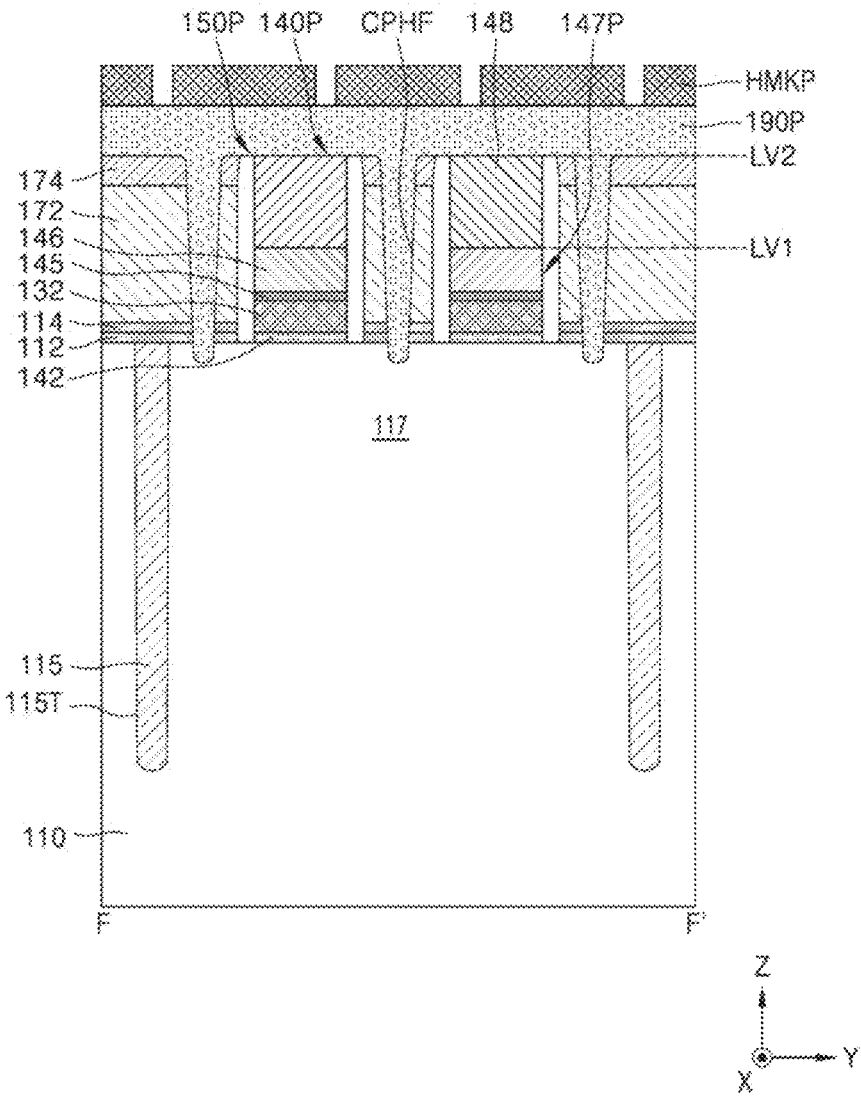
Figure 8G:
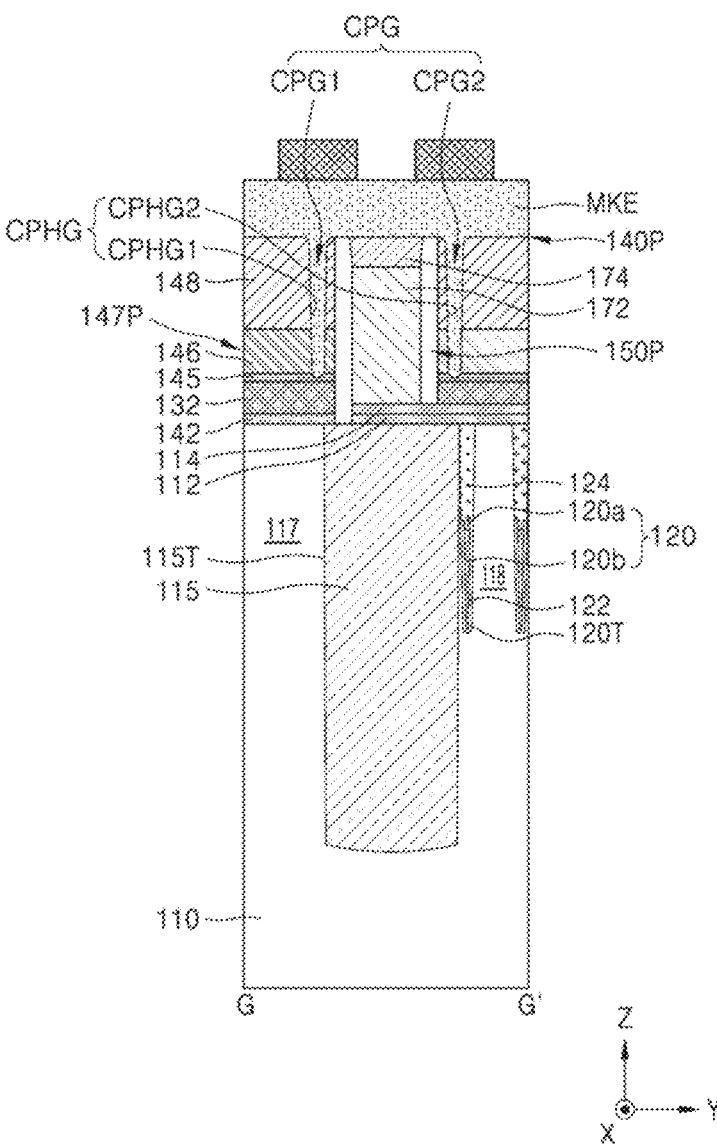

For convenience of illustration, other components than the plurality of logic active regions ACTP and the plurality of gate line patterns GLP are omitted from the peripheral circuit region PR. Although the plurality of gate line patterns GLP are arranged only on the plurality of logic active regions ACTP in FIG. 1, embodiments are not limited thereto. For example, at least some of the plurality of gate line patterns GLP may extend to outside of the logic active regions ACTP, namely, to over a logic device isolation layer 115 of FIGS. 2E through 2G.

The plurality of gate line patterns GLP may be formed at the same level as the plurality of bit lines BL. According to some embodiments, the plurality of gate line patterns GLP and the plurality of bit lines BL may include the same materials or at least partially include the same materials. For example, a process of forming the whole or a portion of the plurality of gate line patterns GLP may be the same as the whole or a portion of a process of forming the plurality of bit lines BL.

FIGS. 2A to 2G, 3A to 3G, 4A to 4G, 5A to 5G, 6A to 6G, 7A to 7G, 8A to 8G, and 9A to 9G are cross-sectional views showing stages in a method of manufacturing a semiconductor memory device, according to example embodiments of the inventive concept, and FIGS. 10A to 10G are cross-sectional views illustrating a semiconductor memory device in stages, according to example embodiments of the inventive concept. FIGS. 2A, 3A, 4A, 5A, 6A, 7A, 8A, 9A, and 10A are cross-sectional views of the stages taken along line A-A' in FIG. 1; FIGS. 2B, 3B, 4B, 5B, 6B, 7B, 8B, 9B, and 10B are cross-sectional views of the stages taken along line B-B' in FIG. 1; FIGS. 2C, 3C, 4C, 5C, 6C, 7C, 8C, 9C, and 10C are cross-sectional views of the stages taken along line C-C' in FIG. 1; FIGS. 2D, 3D, 4D, 5D, 6D, 7D, 8D, 9D, and 10D are cross-sectional views of the stages taken along line D-D' in FIG. 1; FIGS. 2E, 3E, 4E, 5E, 6E, 7E, 8E, 9E, and 10E are cross-sectional views of the stages taken along line E-E' in FIG. 1; FIGS. 2F, 3F, 4F, 5F, 6F, 7F, 8F, 9F, and 10F are cross-sectional views of the stages taken along line F-F' in FIG. 1; and FIGS. 2G, 3G, 4G, 5G, 6G, 7G, 8G, 9G, and 10G are cross-sectional views of the stages taken along line G-G' in FIG. 1.

Referring to FIGS. 2A through 2G, a device isolation trench 116T and a logic device isolation trench 115T may be formed in a substrate 110, and a device isolation layer 116 filling the device isolation trench 116T and a logic device isolation layer 115 filling the logic device isolation trench 115T may be formed. Top surfaces of the substrate 110, the device isolation layer 116, and the logic device isolation layer 115 may be at the same vertical level.

For example, the substrate 110 may include silicon (Si), e.g., crystalline Si, polycrystalline Si, or amorphous Si. Alternatively, the substrate 110 may include a semiconductor element, such as, germanium (Ge), or at least one compound semiconductor selected from silicon germanium (SiGe), silicon carbide (SiC), gallium arsenide (GaAs), indium arsenide (InAs), and indium phosphide (InP). The substrate 110 may have a silicon-on-insulator (SOI) structure. For example, the substrate 110 may include a buried oxide (BOX) layer. The substrate 110 may include a conductive region, for example, an impurity-doped well or an impurity-doped structure.

The device isolation layer 116 and the logic device isolation layer 115 may include a material including, for example, at least one selected from a silicon oxide layer, a silicon nitride layer, and a silicon oxynitride layer. The device isolation layer 116 may be a single layer including one type of insulation layer, a dual layer including two types of insulation layers, or a multi-layer including at least three types of insulation layers. For example, the device isolation layer 116 may be a dual layer or multi-layer including an oxide layer and a nitride layer. However, embodiments of the inventive concept are not limited to the above-described structure of the device isolation layer 116. A plurality of active regions 118 may be defined by the device isolation layer 116 in the memory cell region CR (see active regions ACT of FIG. 1) of the substrate 110, and a plurality of logic active regions 117 may be defined by the logic device isolation layer 115 in the peripheral circuit region PR (see logic active regions ACTP of FIG. 1) of the substrate 110.

In this specification, a portion of the substrate 110 where the plurality of active regions 118 are arranged and an adjacent portion thereof are referred to as the cell region CR, and a portion of the substrate 110 where the plurality of logic active regions 117 are arranged and an adjacent portion thereof are referred to as the peripheral circuit region PR.

According to some embodiments, the device isolation layer 116 and the logic device isolation layer 115 may be formed together and both may be referred to as a device isolation structure. For example, the device isolation layer 116 and the logic device isolation layer 115 may be formed at the same time in the same process and of the same material. The device isolation layer 116 may be a portion of the device isolation structure that defines the plurality of active regions 118, and the logic device isolation layer 115 may be a portion of the device isolation structure that defines the plurality of logic active regions 117. A portion of the device isolation structure that is located at a boundary between the cell region CR and the peripheral circuit region PR may be the device isolation layer 116 or may be the logic device isolation layer 115. The device isolation layer 116 and the logic device isolation layer 115 may not be clearly distinguished from each other at the boundary between the cell region CR and the peripheral circuit region PR.

Like the active regions ACT in FIG. 1, each of the active regions 118 may have a relatively long island shape having a short axis and a long axis according to a planar view. Like the logic active regions ACTP in FIG. 1, each of the logic active regions 117 may have a rectangular shape according to a planar view. However, embodiments are not limited thereto, and each of the logic active regions 117 may have any of various other planar shapes A plurality of word line trenches 120T may be formed in the substrate 110. A plurality of word line trenches 120T may have line shapes, which extend lengthwise in the first horizontal direction (X direction) to be parallel with one another and are arranged at equal intervals across the active regions 118 in the second horizontal direction (Y direction). According to some embodiments, there may be a step on the bottom surface of the plurality of word line trenches 120T. For example, a height in the vertical direction (Z direction) of each of the plurality of word line trenches 120T may vary along the first horizontal direction (X direction). According to some embodiments, to form the plurality of word line trenches 120T each having a step at a bottom surface thereof, the device isolation layer 116 and the substrate 110 may be respectively etched by separate etching processes, and thus have different etch depths. For example, an etch depth of the substrate 110 may be greater than an etch depth of the device isolation layer 116, such that a depth of each of the plurality of word line trenches 120T may be at a higher vertical level over the substrate 110 and at a lower vertical level over the device isolation layer 116. According to some embodiments, to form the plurality of word line trenches 120T each having a step at a bottom surface thereof, the device isolation layer 116 and the substrate 110 may be etched simultaneously but have different etch depths due to a difference between the respective etch rates of the device isolation layer 116 and the substrate 110.

After a resultant structure in which the plurality of word line trenches 120T are formed is cleaned, a plurality of gate dielectric layers 122, a plurality of word lines 120, and a plurality of buried insulation layers 124 may be formed in this stated order within the plurality of word line trenches 120T. The plurality of word lines 120 may constitute the plurality of word lines WL of FIG. 1. The plurality of word lines 120 may have line shapes, which extend lengthwise in the first horizontal direction (X direction) to be parallel with one another and are arranged at equal intervals across the active regions 118 in the second horizontal direction (Y direction). The top surfaces of the plurality of word lines 120 may be at a lower level than the top surface of the substrate 110. The bottom surfaces of the plurality of word lines 120 may have irregular shapes, and a transistor having a saddle fin structure, e.g., a saddle fin field effect transistor (Fin-FET), may be formed in the plurality of active regions 118.

In this specification, the term "level" refers to a height from the main surface or the top surface of the substrate 110 in the vertical direction (Z direction). For example, "being at the same level" or "being at a certain level" refers to "having the same height from the main or top surface of the substrate 110 in the vertical direction (Z direction)" or "being at a certain position with respect to the main or top surface of the substrate 110 in the vertical direction (Z direction)", and "being at a lower/higher level" refers to "being at a lower/higher position with respect to the main or top surface of the substrate 110 in the vertical direction (Z direction)".

Each of the plurality of word lines 120 may be a stack including a lower word line layer 120*a* and an upper word line layer 120*b*. For example, the lower word line layer 120*a* may be formed of a metal material, a conductive metal nitride, or a combination thereof. According to some embodiments, the lower word line layer 120*a* may include Ti, TiN, Ta, TaN, W, WN, TiSiN, WSiN, or a combination thereof. For example, the upper word line layer 120*b* may include doped polysilicon. A lower surface of the upper word line layer 120*b* may contact an upper surface of the lower word line layer 120*a*. According to some embodiments, the lower word line layer 120*a* may include a core layer, and a barrier layer arranged between the core layer and a gate dielectric layer 122. For example, the core layer may include a metal material or conductive metal nitride, such as W, WN, TiSiN, or WSiN, and the barrier layer may include a metal material or conductive metal nitride, such as Ti, TiN, Ta, or TaN. As used herein, when an element is referred to as "contacting" or "in contact with" another element, there are no intervening elements present at the point of contact.

According to some embodiments, before or after the plurality of word lines 120 are formed, impurity ions may be injected into the active regions 118 of the substrate 110 on both sides of each of the plurality of word lines 120, thereby forming source regions and drain regions within the plurality of active regions ACT.

Each of the plurality of gate dielectric layers 122 may be formed of at least one selected from a silicon oxide layer, a silicon nitride layer, a silicon oxynitride layer, oxide/nitride/oxide (ONO), or a high-k dielectric film having a higher dielectric constant than a silicon oxide layer. For example, each of the plurality of gate dielectric layers 122 may have a dielectric constant of about 10 to about 25. According to some embodiments, the plurality of gate dielectric layers 122 may be formed of at least one selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (Ba-TiO), strontium titanium oxide (SrTiO), yttrium oxide (YO), aluminum oxide (AlO), and lead scandium tantalum oxide (PbScTaO). For example, the plurality of gate dielectric layers 122 may be formed of $HfO_2$, $Al_2O_3$, $HfAlO_3$, $Ta_2O_3$, or $TiO_2$.

The top surfaces of the plurality of buried insulation layers 124 may be substantially at the same level as the top surface of the substrate 110. Each of the plurality of buried insulation layers 124 may include at least one material layer selected from a silicon oxide layer, a silicon nitride layer, a silicon oxynitride layer, and a combination thereof. A bottom surface of each of the plurality of buried insulation layers 124 may contact top surfaces of corresponding ones of the plurality of word lines 120.

Referring to FIGS. 3A through 3G, an insulation layer pattern (including first and second insulation layer patterns 112 and 114) is formed to cover the device isolation layer 116, the plurality of active regions 118, the plurality of buried insulation layers 124, the logic device isolation layer 115, and the plurality of logic active regions 117. For example, the insulation layer pattern (including first and second insulation layer patterns 112 and 114) may include a silicon oxide layer, a silicon nitride layer, a silicon oxynitride layer, a metal dielectric layer, or a combination thereof. According to some embodiments, the insulation layer pattern (including first and second insulation layer patterns 112 and 114) may be formed by stacking a plurality of insulation layers including the first insulation layer pattern 112 and the second insulation layer pattern 114. According to some embodiments, the first insulation layer pattern 112 may include a silicon oxide layer, and the second insulation layer pattern 114 may include a silicon nitride layer.

According to some embodiments, the first insulation layer pattern 112 may include a nonmetal dielectric layer, and the second insulation layer pattern 114 may include a metal dielectric layer. For example, the first insulation layer pattern 112 may include a silicon oxide layer, a silicon nitride layer, a silicon oxynitride layer, or a combination thereof. For example, the second insulation layer pattern 114 may include at least one selected from hafnium oxide (HfO), hafnium silicate (HfSiO), hafnium oxynitride (HON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

Thereafter, a plurality of direct contact holes 134H are formed to penetrate the insulation layer pattern (including first and second insulation layer patterns 112 and 114) and expose a source region in a corresponding active region 118. According to some embodiments, the direct contact holes 134H may extend inside the corresponding active region 118, i.e., the source region. For example, each direct contact hole 134H may extend to a level lower than that of the top surfaces of the corresponding active regions 118 and device isolation layers 116.

Referring to FIGS. 4A through 4G, a direct contact conductive layer is formed on the plurality of active regions 118 and the device isolation layer 116 to fill the direct contact holes 134H and cover the insulation layer pattern (including first and second insulation layer patterns 112 and 114). The direct contact conductive layer may include, for example, Si, Ge, W, WN, Co, Ni, Al, Mo, Ru, Ti, TiN, Ta, TaN, Cu, or a combination thereof. According to some embodiments, the direct contact conductive layer may include an epitaxial silicon layer. According to some embodiments, the direct contact conductive layer may include doped polysilicon.

Thereafter, a metal conductive layer and an insulation capping layer, which are for forming bit line structures 140, are sequentially formed to cover the insulation layer pattern (including first and second insulation layer patterns 112 and 114) and the direct contact conductive layer.

According to some embodiments, the metal conductive layer may have a stack structure in which a first metal conductive layer and a second metal conductive layer are stacked. The metal conductive layer may have a conductive layer stack structure having a double-layer structure, but this is just an example and embodiments are not limited thereto. For example, the metal conductive layer may include a single layer or a stack structure including at least three layers.

The first metal conductive layer, the second metal conductive layer, and the insulation capping layer are etched, thereby forming a plurality of bit lines 147 each including a first metal conductive pattern 145 and a second metal conductive pattern 146, which have a line shape, and a plurality of insulation capping lines 148.

According to some embodiments, the first metal conductive pattern 145 may include a TiN or Ti—Si—N(TSN), and the second metal conductive pattern 146 may include tungsten (W) or W and tungsten silicide ($WSi_x$). According to some embodiments, the first metal conductive pattern 145 may function as a diffusion barrier. According to some embodiments, the plurality of insulation capping lines 148 may include a silicon nitride layer.

One bit line 147 and one insulation capping line 148 covering the bit line 147 may constitute one bit line structure 140. A plurality of bit line structures 140 including a plurality of bit lines 147 and a plurality of insulation capping lines 148 may each extend lengthwise in the second horizontal direction (Y direction) parallel to the main surface of the substrate 110 to be parallel with each other. The plurality of bit lines 147 may constitute the plurality of bit lines BL of FIG. 1. According to some embodiments, each of the plurality of bit line structures 140 may further include a conductive semiconductor pattern 132 between the insulation layer pattern (including first and second insulation layer patterns 112 and 114) and the first metal conductive pattern 145. The conductive semiconductor pattern 132 may include doped polysilicon. According to some embodiments, the conductive semiconductor pattern 132 may be omitted.

During an etching process of forming the plurality of bit lines 147, portions of the direct contact conductive layer that do not vertically overlap the plurality of bit lines 147 may also be etched, thereby forming a plurality of direct contact conductive patterns 134. At this time, the insulation layer pattern (including first and second insulation layer patterns 112 and 114) may function as an etch stop layer during the etching process of forming the plurality of bit lines 147 and the plurality of direct contact conductive patterns 134. The plurality of direct contact conductive patterns 134 may constitute the plurality of direct contacts DC of FIG. 1. The plurality of bit lines 147 may be electrically connected to the plurality of active regions 118 via plurality of direct contact conductive patterns 134.

According to some embodiments, the conductive semiconductor patterns 132 may also be formed during a process of removing the portions of the direct contact conductive layer to form the direct contact conductive patterns 134. For example, the conductive semiconductor patterns 132 may be portions of the direct contact conductive layer that vertically overlap the bit lines 147 but do not vertically overlap the direct contact holes 134H and are located on the insulation layer pattern (including first and second insulation layer patterns 112 and 114), and the direct contact conductive patterns 134 may be portions of the direct contact conductive layer that vertically overlap the direct contact holes 134H and are in contact with active regions 118.

An insulation spacer structure 150 may cover both sidewalls of each of the plurality of bit line structures 140. Each of the plurality of insulation spacer structures 150 may include a first insulation spacer 152, a second insulation spacer 154, and a third insulation spacer 156. The second insulation spacer 154 may include a material having a lower permittivity than the first insulation spacer 152 and the third insulation spacer 156. According to some embodiments, the first insulation spacer 152 and the third insulation spacer 156 may include a nitride layer, and the second insulation spacer 154 may include an oxide layer. According to some embodiments, the first insulation spacer 152 and the third insulation spacer 156 may include a nitride layer, and the second insulation spacer 154 may include a material having an etch selectivity with respect to the first insulation spacer 152 and the third insulation spacer 156. For example, when the first insulation spacer 152 and the third insulation spacer 156 include a nitride layer, the second insulation spacer 154 may include an oxide layer and may be removed during a subsequent process to be an air spacer.

A plurality of buried contact holes 170H may be formed between each of the plurality of bit lines 147. The inner space of each of the plurality of buried contact holes 170H may be defined by insulation spacer structures 150 respectively covering respective sidewalls of two adjacent bit lines 147 from among the plurality of bit lines 147 and an active region 118 between the two adjacent bit lines 147. In addition, the inner space of each of the plurality of buried contact holes 170H may be further defined by side surfaces of the first and second insulation layer patterns 112 and 114 of one of the two adjacent bit lines 147.

The plurality of buried contact holes 170H may be formed by partially removing the insulation layer pattern (including first and second insulation layer patterns 112 and 114) and the active regions 118 by using, as etching masks, the plurality of insulation spacer structures 150, each covering both sidewalls of each of the plurality of bit line structures 140, and the plurality of insulation capping lines 148. According to some embodiments, the plurality of buried contact holes 170H may be formed by first performing an anisotropic etching process of partially removing the insulation layer pattern (including first and second insulation layer patterns 112 and 114) and the active regions 118 by using, as etching masks, the insulation spacer structures 150, each covering both side walls of each of the plurality of bit line structures 140, and the plurality of insulation capping lines 148 and then performing an isotropic etching process of further partially removing the active regions 118 such that the respective spaces of the buried contact holes 170H, which are defined by the active regions 118, may be extended.

A plurality of gate line structures 140P may be formed on the logic active regions 117. According to some embodiments, at least one dummy bit line structure 140D may be arranged between each bit line structure 140 and each gate line structure 140P.

Each of the plurality of gate line structures 140P may include a gate line 147P and an insulation capping line 148 covering the gate line 147P. The plurality of gate lines 147P included in the plurality of gate line structures 140P may be formed together with the plurality of bit lines 147. For example, the plurality of gate lines 147P may be a stack of the first metal conductive pattern 145 and the second metal conductive pattern 146. A gate insulation layer pattern 142 may be disposed between each gate line 147P and each logic active region 117. According to some embodiments, each of the plurality of gate line structures 140P may further include a conductive semiconductor pattern 132 between the gate insulation layer pattern 142 and the first metal conductive pattern 145. The plurality of gate lines 147P may constitute the plurality of gate line patterns GLP of FIG. 1.

A gate insulation spacer 150P may cover both sidewalls of each gate line structure 140P. The gate insulation spacer 150P may include, for example, a nitride layer. According to some embodiments, the gate insulation spacer 150P may include a single layer, but embodiments are not limited thereto. The gate insulation spacer 150P may have a stack structure including two or more layers.

Each dummy bit line structure 140D may extend lengthwise in the second horizontal direction (Y direction) to be parallel with the bit line structures 140. Each dummy bit line structure 140D may have a substantially similar structure to each bit line structure 140. Each dummy bit line structure 140D may include a dummy bit line 147D including the first metal conductive pattern 145 and the second metal conductive pattern 146, and an insulation capping line 148. Both sidewalls of the dummy bit line structure 140D may be covered by at least one of the insulation spacer structure 150 and the gate insulation spacer 150P.

According to some embodiments, a horizontal width of the dummy bit line 147D in the first horizontal direction (X direction) may be greater than a horizontal width of each of the bit lines 147 in the first horizontal direction (X direction). According to some other embodiments, the horizontal width of the dummy bit line 147D in the first horizontal direction (X direction) may be equal to the horizontal width of each of the bit lines 147 in the first horizontal direction (X direction). According to some embodiments, a plurality of dummy bit line structures 140D may be included, and the dummy bit lines 147D of some of the plurality of dummy bit line structures 140D may have horizontal widths in the first horizontal direction (X direction) that are greater than the horizontal width of each bit line 147 and the dummy bit lines 147D of the others of the plurality of dummy bit line structures 140D may have horizontal widths in the first horizontal direction (X direction) that are equal to the horizontal width of each bit line 147.

Referring to FIGS. 5A through 5G, a plurality of buried contacts 170 and a plurality of insulation fences 180 are formed in spaces among the plurality of insulation spacer structures 150 respectively covering the sidewalls of the plurality of bit line structures 140. The plurality of buried contacts 170 and the plurality of insulation fences 180 may be alternately arranged between every two adjacent insulation spacer structures 150 among the plurality of insulation spacer structures 150, which respectively cover the sidewalls of the plurality of bit line structures 140, in the second horizontal direction (Y direction). For example, the plurality of buried contacts 170 may include polysilicon. For example, the plurality of insulation fences 180 may include a nitride layer.

According to some embodiments, the plurality of buried contacts 170 may be arranged in a line in each of the first horizontal direction (X direction) and a line in the second horizontal direction (Y direction). Each of the plurality of buried contacts 170 may extend from an active region 118 in the vertical direction (Z direction) perpendicular to the substrate 110. The plurality of buried contacts 170 may constitute the plurality of buried contacts BC of FIG. 1.

The plurality of buried contacts 170 may be arranged in spaces defined by the plurality of insulation spacer structures 150, respectively covering the sidewalls of the plurality of bit line structures 140, and the plurality of insulation fences 180. The plurality of buried contacts 170 may fill a lower portion of the spaces between the plurality of insulation spacer structures 150, respectively covering the sidewalls of the plurality of bit line structures 140.

The top surfaces of the plurality of buried contacts 170 may be at a lower level than the top surfaces of the plurality of insulation capping lines 148. The top surfaces of the plurality of insulation fences 180 may be at the same level as the top surfaces of the plurality of insulation capping lines 148 in the vertical direction (Z direction).

A plurality of landing pad holes 190H may be defined by the plurality of insulation spacer structures 150 and the plurality of insulation fences 180. The plurality of landing pad holes 190H may vertically overlap the plurality of buried contacts 170. The plurality of buried contacts 170 may be exposed at the bottoms of the plurality of landing pad holes 190H.

A filling insulation layer (including first and second filling insulation layers 172 and 174) may be formed on the insulation layer pattern (including first and second insulation layer patterns 112 and 114) around the plurality of gate line structures 140P. According to some embodiments, the filling insulation layer (including first and second filling insulation layers 172 and 174) may have a stack structure in which the first filling insulation layer 172 and the second filling insulation layer 174 are stacked. According to some embodiments, the first filling insulation layer 172 may include oxide, and the second filling insulation layer 174 may include nitride. The top surface of the filling insulation layer (including first and second filling insulation layers 172 and 174), that is, the top surface of the second filling insulation layer 174, may be at the same level as the top surface of each gate line structure 140P.

While the plurality of buried contacts 170 and/or the plurality of insulation fences 180 are being formed, the respective upper portions of the insulation capping line 148 included in the bit line structures 140, the dummy bit line structures 140D, and the gate line structures 140P, the insulation spacer structures 150, and the gate insulation spacer 150P may be partially removed, and thus the levels of the top surfaces of the bit line structures 140, the dummy bit line structures 140D, and the gate line structures 140P may be decreased.

Referring to FIGS. 6A through 6G, a plurality of contact holes CPHE, CPHF, and CPHG penetrating the filling insulation layer (including first and second filling insulation layers 172 and 174) and the insulation layer pattern (including first and second insulation layer patterns 112 and 114) are formed. The plurality of contact holes CPHE, CPHF, and CPHG may include a first contact hole CPHE, a second contact hole CPHF, and third contact holes CPHG. The third contact holes CPHG may include a gate line contact hole CPHG1 and a bit line contact hole CPHG2. The first contact hole CPHE and the second contact hole CPHF may be referred to as a word line contact hole CPHE and a logic active region contact hole CPHF, respectively.

The word line contact hole CPHE may extend to a lower word line layer 120a by penetrating the filling insulation layer (including first and second filling insulation layers 172 and 174), the insulation layer pattern (including first and second insulation layer patterns 112 and 114), a buried insulation layer 124, and an upper word line layer 120b. According to some embodiments, the word line contact hole CPHE may stretch into the lower word line layer 120a.

The logic active region contact hole CPHF may extend to the logic active region 117 by penetrating the filling insulation layer (including first and second filling insulation layers 172 and 174) and the insulation layer pattern (including first and second insulation layer patterns 112 and 114). According to some embodiments, the logic active region contact holes CPHF may stretch into the logic active region 117.

According to some embodiments, the third contact holes CPHG, namely, the gate line contact hole CPHG1 and the bit line contact hole CPHG2, may extend to the first metal conductive patterns 145 by penetrating the insulation capping lines 148 and the second metal conductive patterns 146. According to some embodiments, the third contact holes CPHG, namely, the gate line contact hole CPHG1 and the bit line contact hole CPHG2, may stretch into the first metal conductive patterns 145. According to some other embodiments, the third contact holes CPHG, namely, the gate line contact hole CPHG1 and the bit line contact hole CPHG2, may extend to the second metal conductive patterns 146 by penetrating the insulation capping lines 148. According to some other embodiments, the third contact holes CPHG, namely, the gate line contact hole CPHG1 and the bit line contact hole CPHG2, may stretch into the second metal conductive patterns 146.

For example, the gate line contact hole CPHG1 may extend to a gate line 147P by penetrating an insulation capping line 148, and the bit line contact hole CPHG2 may extend to a bit line 147 by penetrating an insulation capping line 148. According to some embodiments, the gate line contact holes CPHG1 may stretch into the gate line 147P by penetrating the insulation capping line 148, and the bit line contact holes CPHG2 may stretch into the bit line 147 by penetrating the insulation capping line 148.

According to some embodiments, the first contact hole CPHE, the second contact hole CPHF, and the third contact holes CPHG may be formed simultaneously by using the same etching process. According to some other embodiments, at least one of the first contact hole CPHE, the second contact hole CPHF, and the third contact holes CPHG may be sequentially formed by using separate etching processes.

Referring to FIGS. 7A through 7G, an extended mask pattern MKE having an extended opening MKEO that exposes the first contact hole CPHE and portions of the filling insulation layer (including first and second filling insulation layers 172 and 174 that are adjacent to the first contact hole CPHE) is formed. The extended mask pattern MKE may cover the remaining portions of the filling insulation layer (including first and second filling insulation layers 172 and 174). The extended mask pattern MKE may fill the second contact hole CPHF and the third contact holes CPHG and may cover the bit line structures 140, the dummy bit line structures 140D, the gate line structures 140P, the buried contacts 170, and the insulation fences 180.

Thereafter, a hole extension HE may be formed in an upper portion of the first contact hole CPHE by removing the portions of the filling insulation layer (including first and second filling insulation layers 172 and 174) exposed via the extended opening MKEO by using the extended mask pattern MKE as an etching mask. After the hole extension HE is formed, the extended mask pattern MKE may be removed. While the hole extension HE is being formed, the vertical level of the bottom surface of the first contact hole CPHE may decrease.

Referring to FIGS. 8A through 8G, after the hole extension HE is formed and the extended mask pattern MKE is removed, a landing pad material layer 190P is formed to fill the plurality of landing pad holes 190H and the plurality of contact holes CPHE, CPHF, and CPHG and cover the plurality of bit line structures 140, the plurality of gate line structures 140P and the at least one dummy bit line structure 140D.

The hole extension HE may be formed by partially removing the filling insulation layer (including first and second filling insulation layers 172 and 174). Due to the hole extension HE, a horizontal width and a horizontal cross-section of the upper portion of the first contact hole CPHE may be increased. For example, a horizontal width of the upper portion of the first contact hole CPHE adjacent to the second filling insulation layer 174 may be wider than a horizontal width of a lower portion of the first contact hole CPHE adjacent to a lower portion of the first filling insulation layer 172. The bottom surface of the hole extension HE may have a higher vertical level than a first vertical level LV1 of the top surface of the bit line 147 or the gate line 147P, namely, the top surface of the second metal conductive pattern 146. For example, the vertical level of the bottom surface of the hole extension HE may be higher than the first vertical level LV1 of the top surface of the second metal conductive pattern 146, and may be lower than a second vertical level LV2 of the top surface of the insulation capping line 148 or the top surface of the filling insulation layer (including first and second filling insulation layers 172 and 174), namely, the top surface of the second filling insulation layer 174. In some embodiments, the vertical level of the bottom surface of the hole extension HE may be lower than a top surface of the first filling insulation layer 172.

According to some embodiments, the landing pad material layer 190P may include a conductive barrier layer and a conductive pad material layer disposed on the conductive barrier layer. For example, the conductive barrier layer may include metal, conductive metal nitride, or a combination thereof. According to some embodiments, the conductive barrier layer may have a Ti/TiN stack structure. According to some embodiments, the conductive pad material layer may include tungsten (W).

According to some embodiments, before the landing pad material layer 190P is formed, a metal silicide layer may be formed on the plurality of buried contacts 170. The metal silicide layer may be arranged between the plurality of buried contacts 170 and the landing pad material layer 190P. The metal silicide layer may include, but is not limited to, cobalt silicide ($CoSi_x$), nickel silicide ($NiSi_x$), or manganese silicide ($MnSi_x$).

A plurality of hard mask patterns HMKC and HMKP are formed on the landing pad material layer 190P. According to some embodiments, the plurality of hard mask patterns HMKC and HMKP may be formed by extreme ultraviolet (EUV) lithography. The plurality of hard mask patterns HMKC and HMKP may include a cell hard mask pattern HMKC arranged on the plurality of landing pad holes 190H and portions of the landing pad material layer 190P around the plurality of landing pad holes 190H and a logic hard mask patterns HMKP arranged on the plurality of contact holes CPHE, CPHF, and CPHG and portions of the landing pad material layer 190P around the plurality of contact holes CPHE, CPHF, and CPHG. In some embodiments, the cell hard mask pattern HMKC may at least partially overlap the landing pad holes 190H, and the logic hard mask pattern HMKP may vertically overlap the contact holes CPHE, CPHF, and CPHG.

Figure 9A:
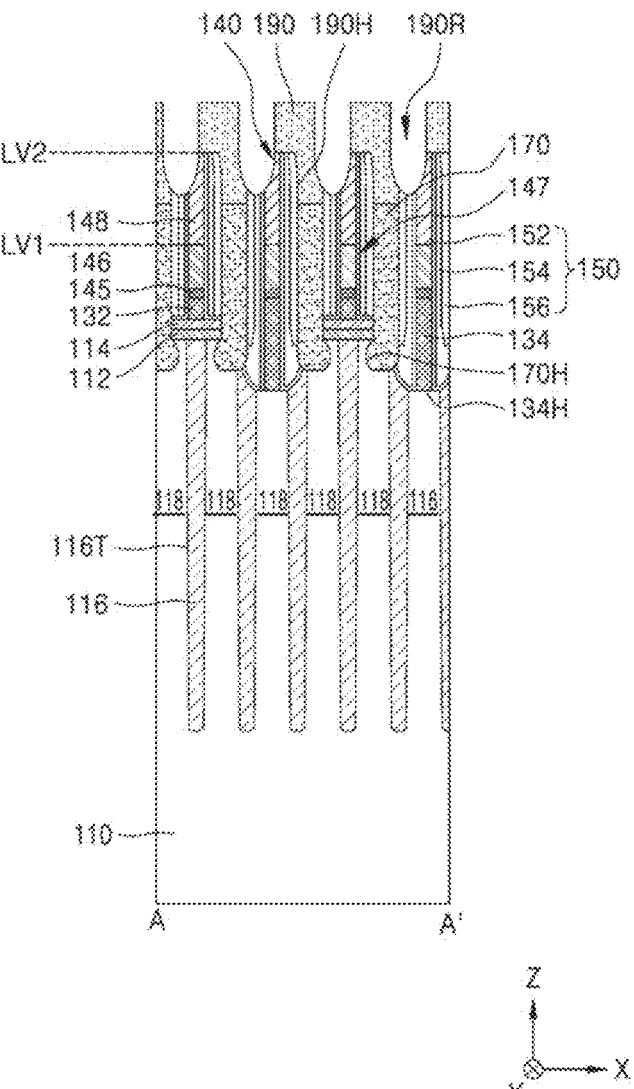
Figure 9B:
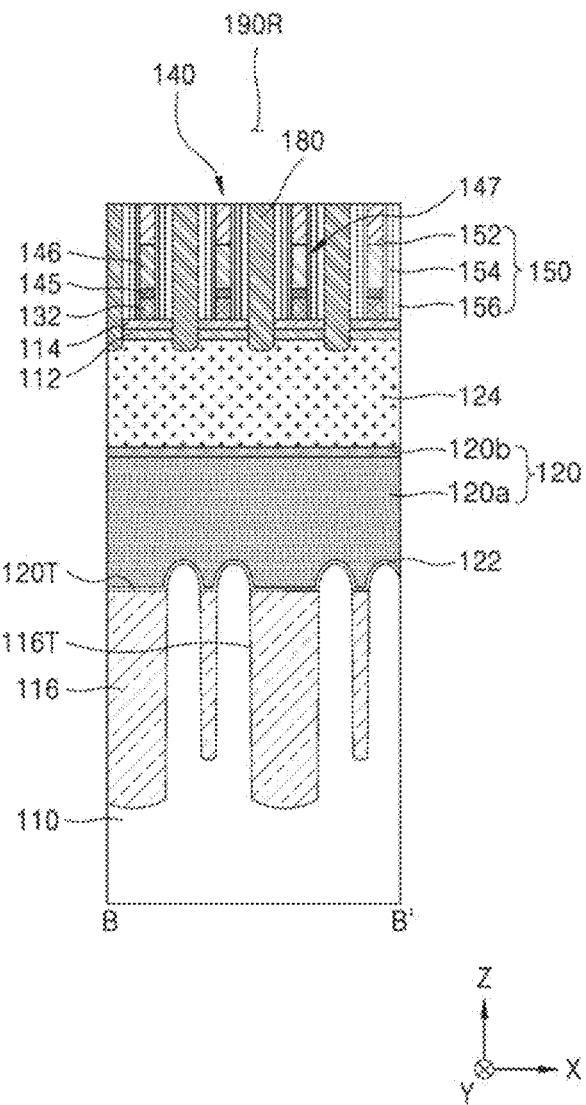
Figure 9C:
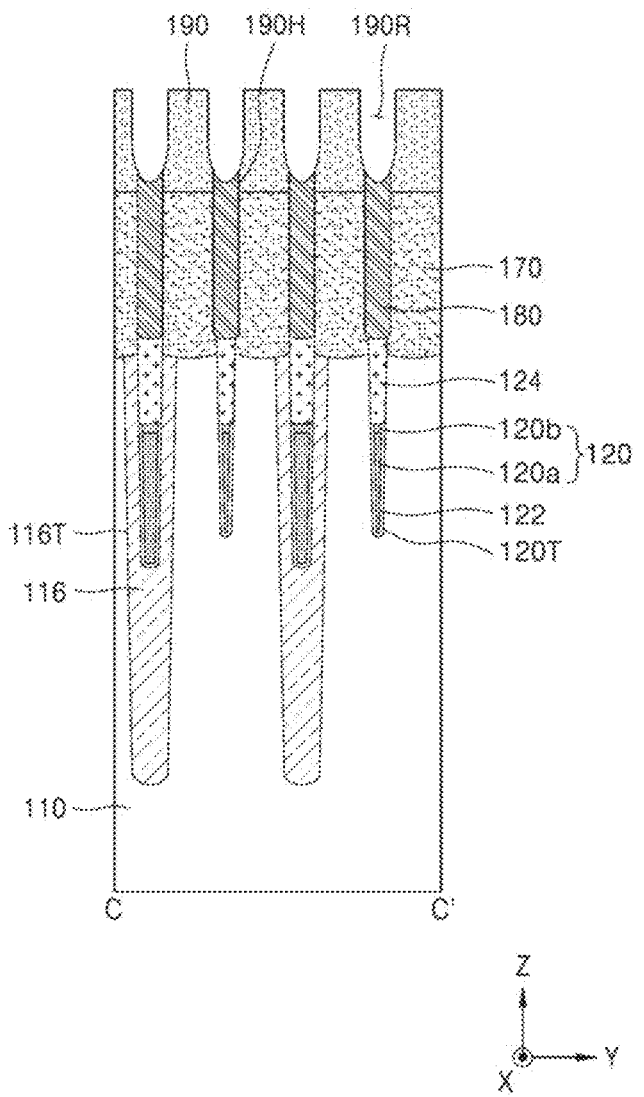
Figure 9D:
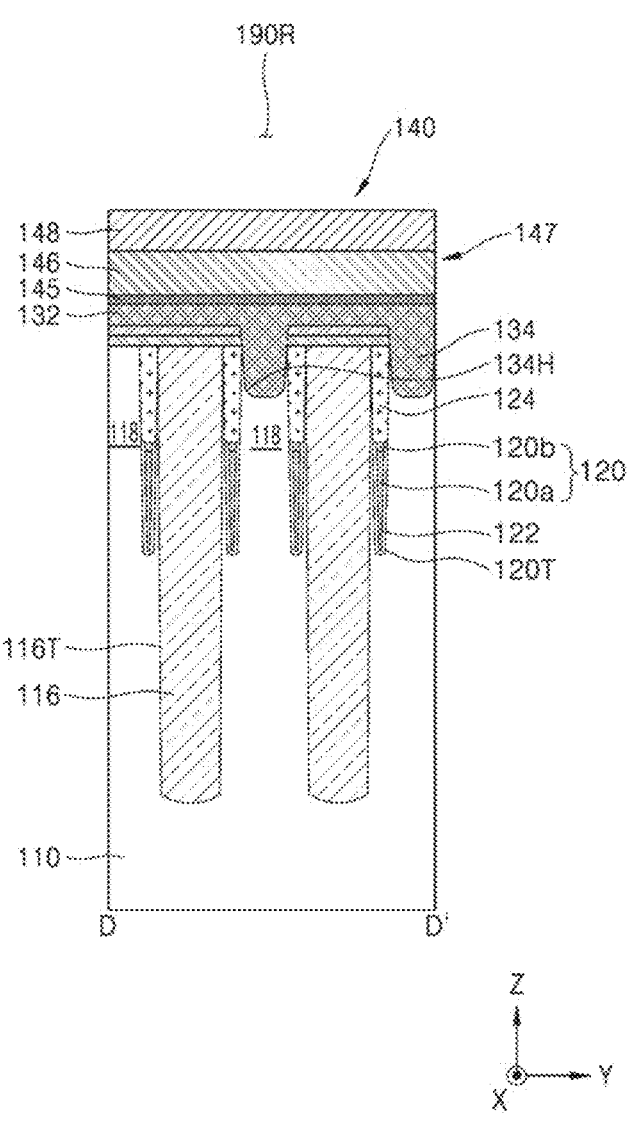
Figure 9E:
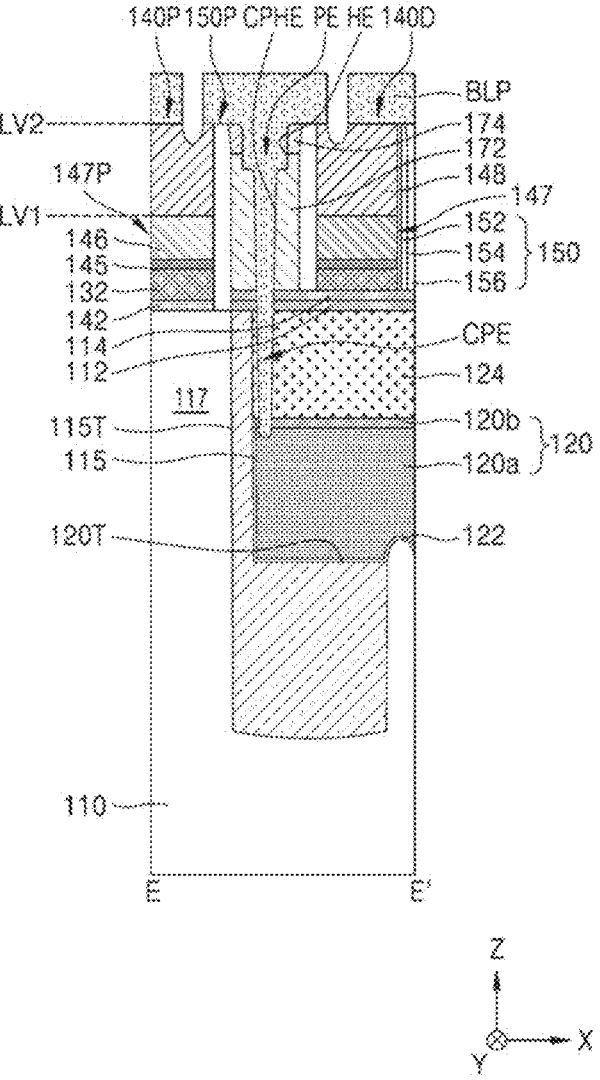
Figure 9F:
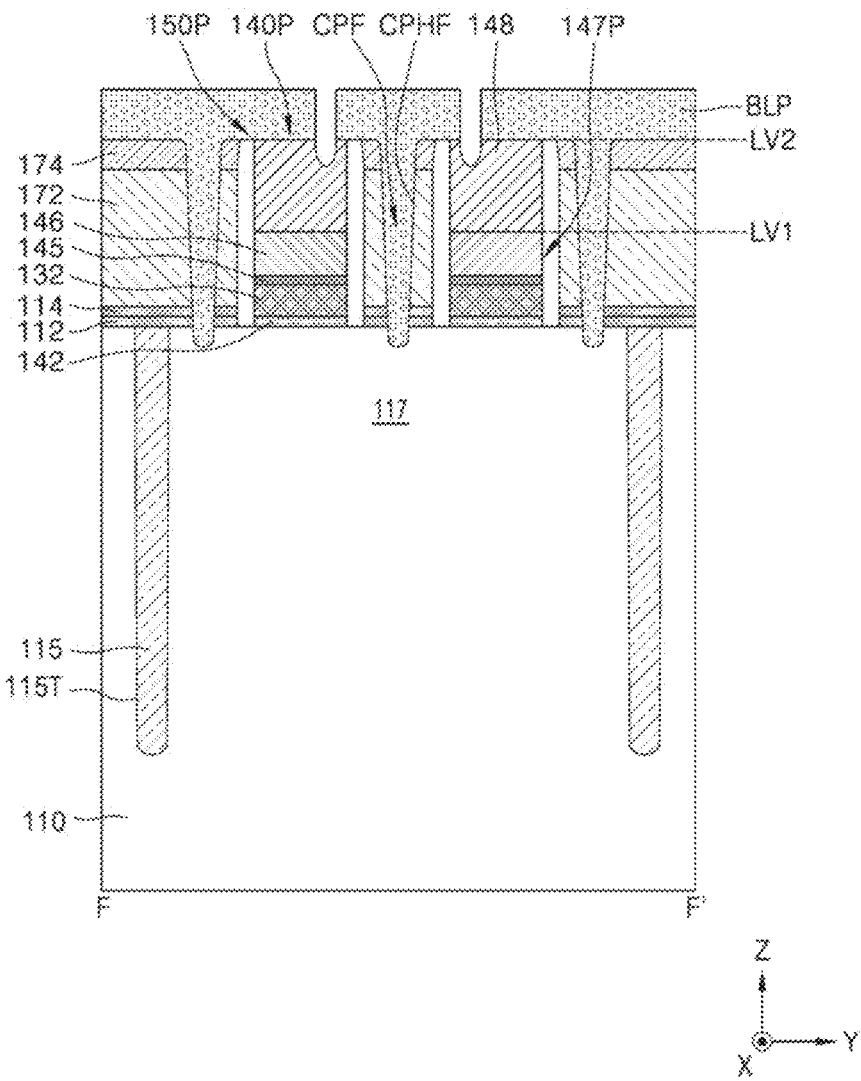
Figure 9G:
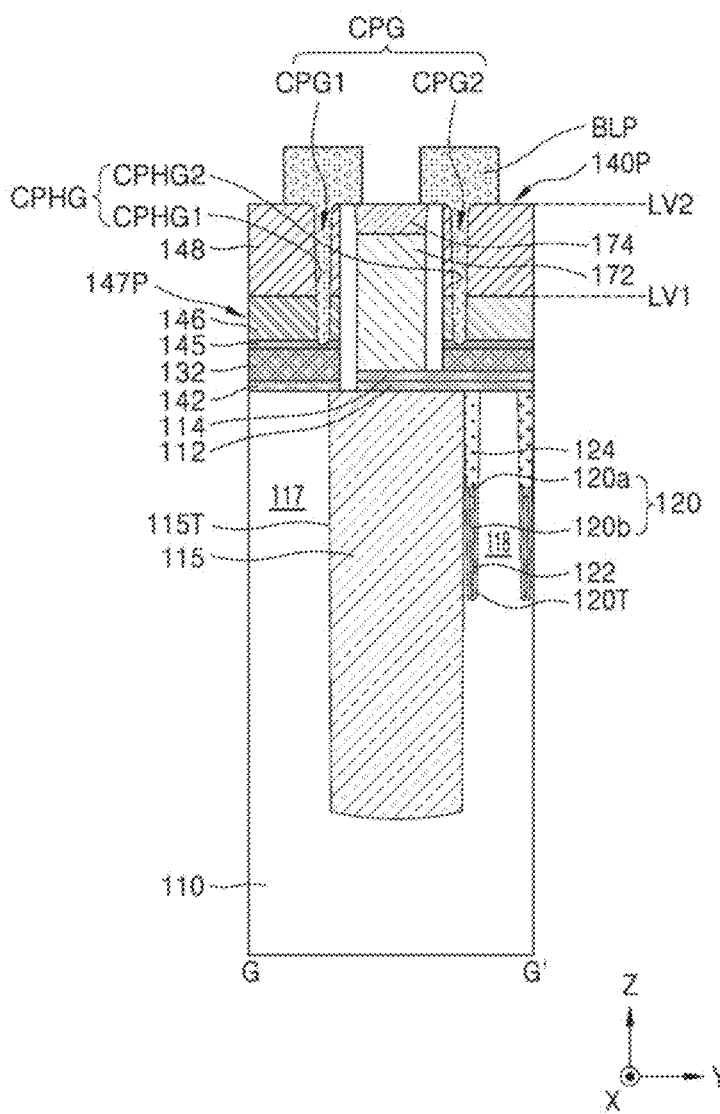
Figure 10A:
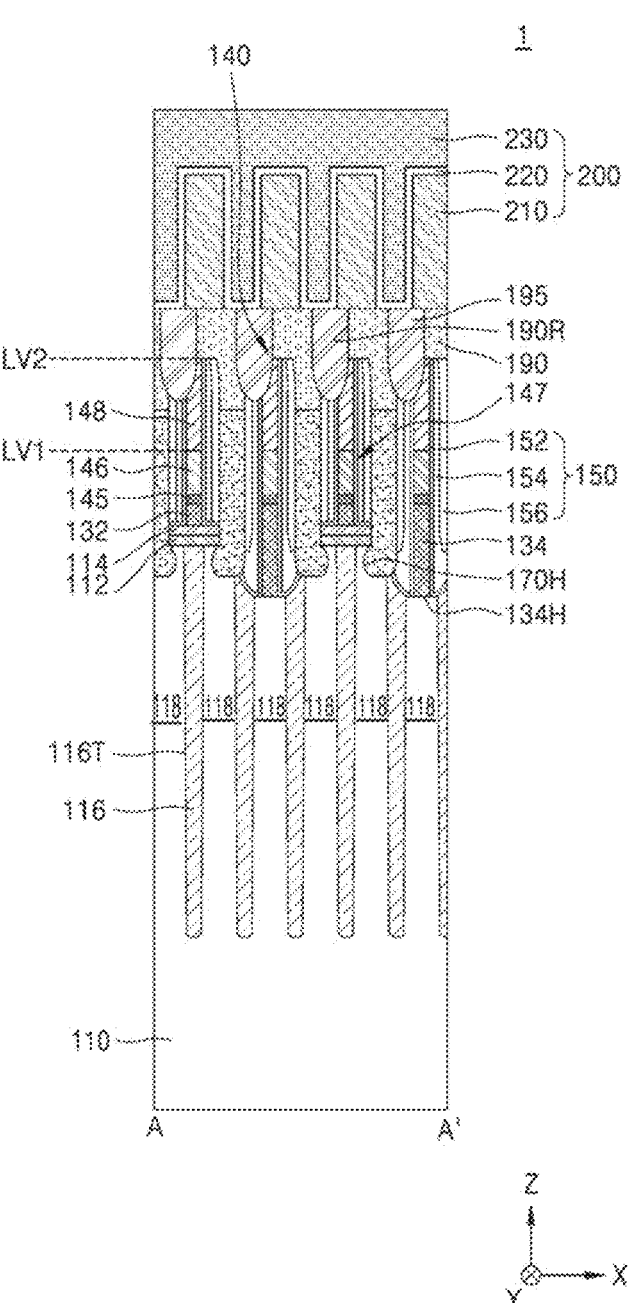
FIGS. 10A to 10G are cross-sectional views illustrating a semiconductor memory device in stages, according to example embodiments of the inventive concept.
Figure 10B:
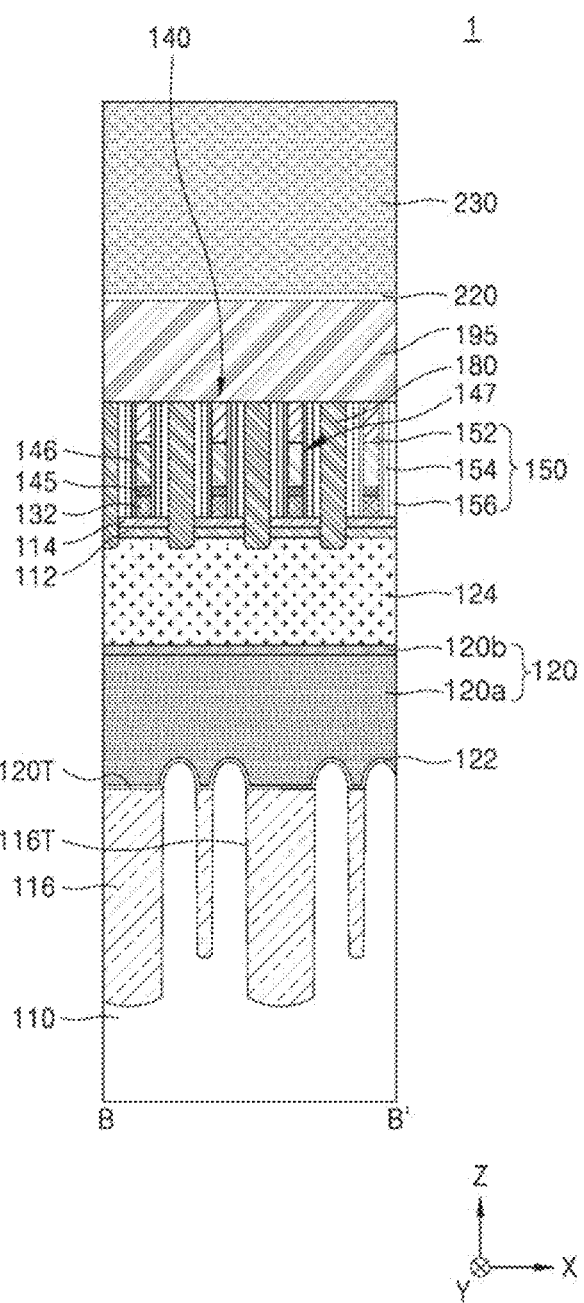
Figure 10C:
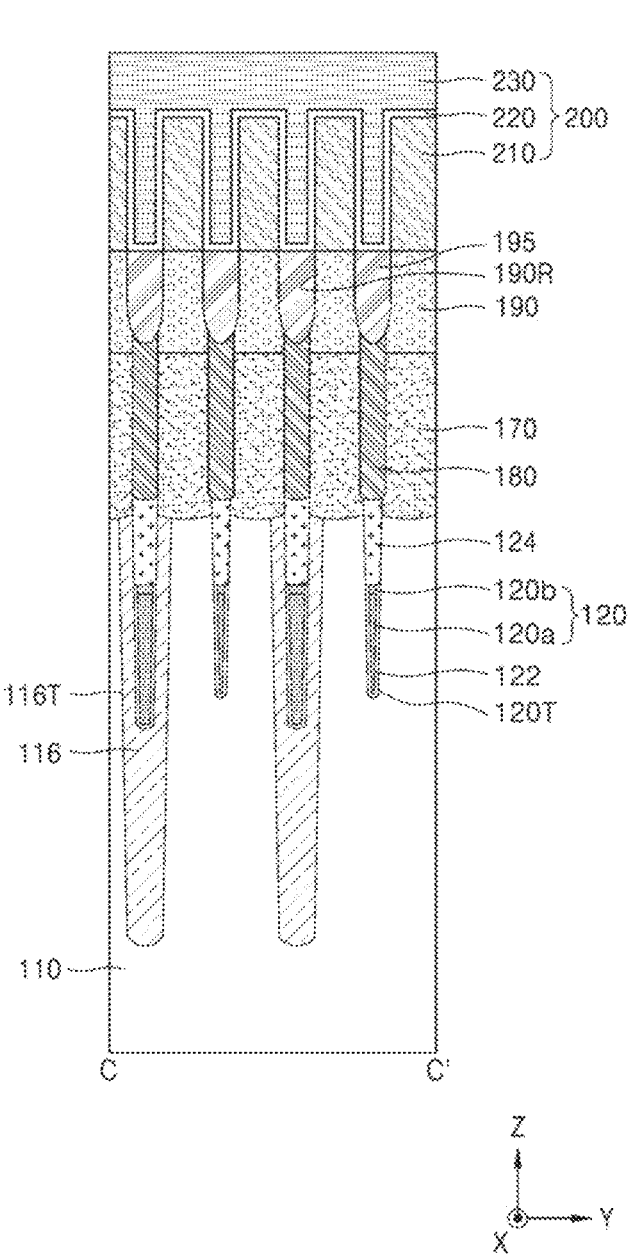
Figure 10D:
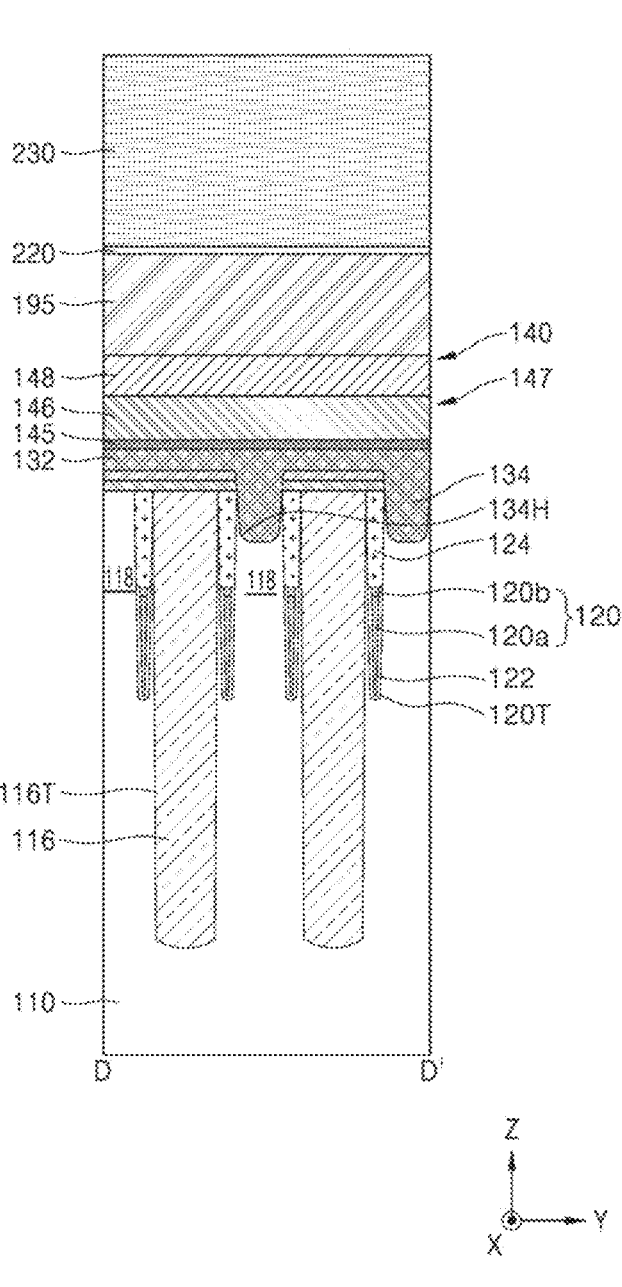
Figure 10E:
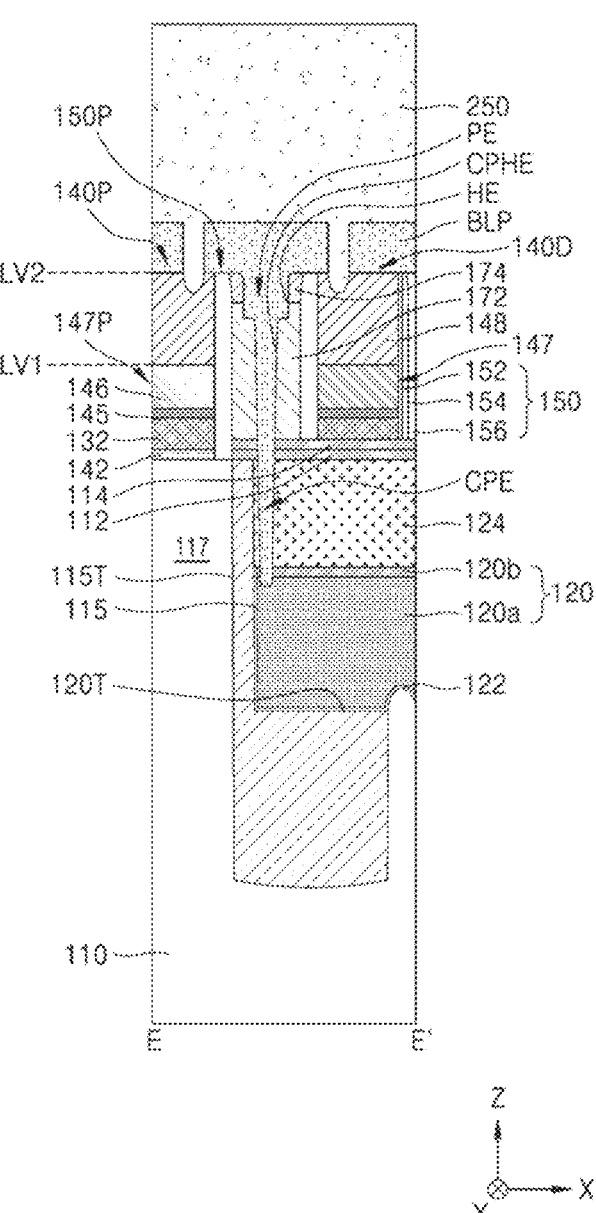
Figure 10F:
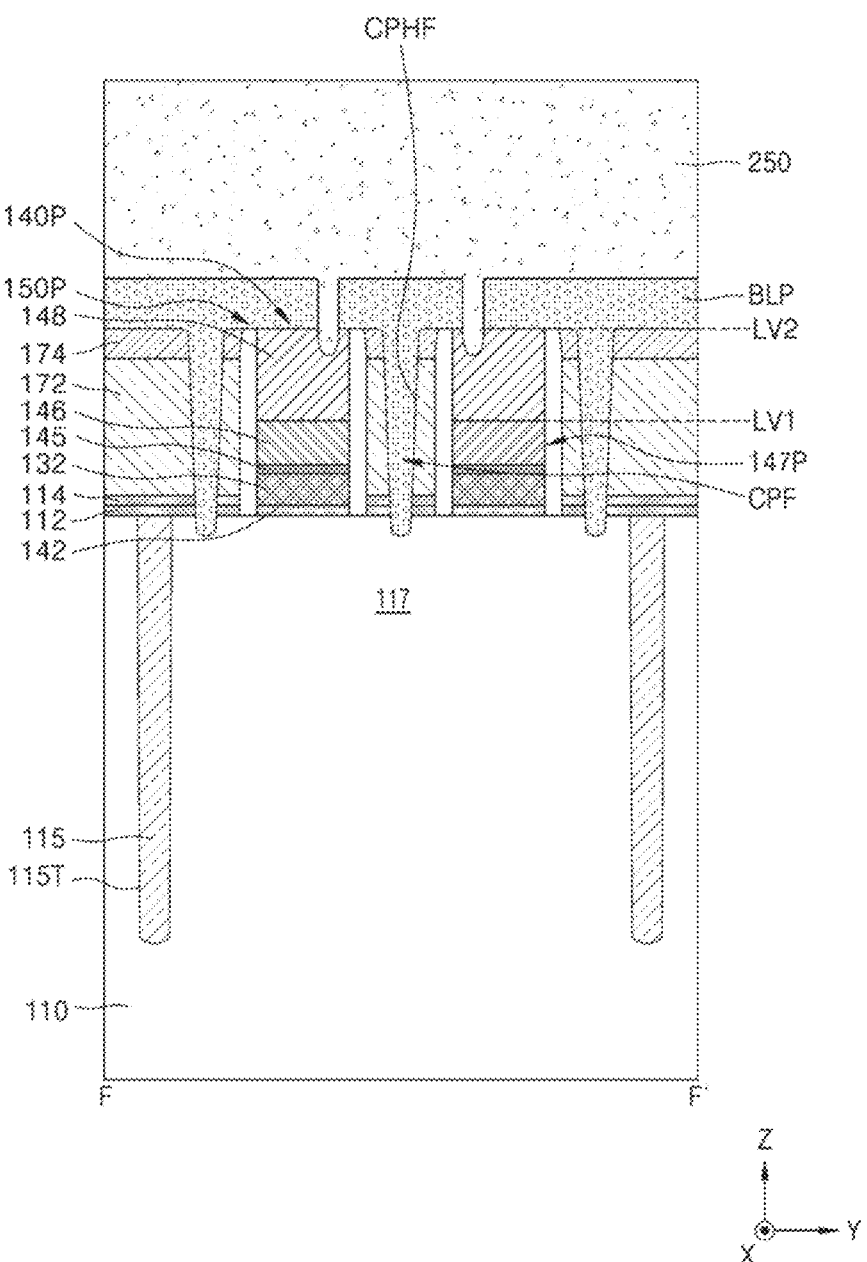
Figure 10G:
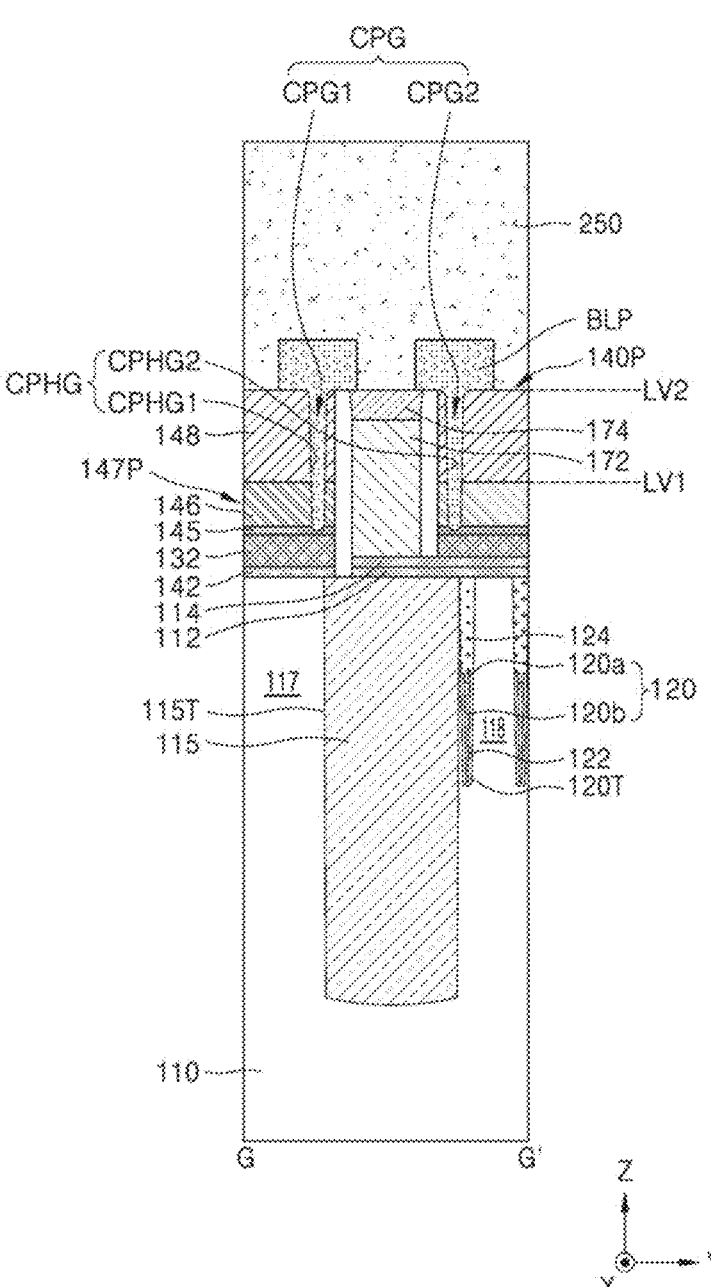

Referring to FIGS. 9A through 9G, a plurality of landing pads 190 at least partially filling the plurality of landing pad holes 190H and extending over the plurality of bit line structures 140 are formed by removing portions of the plurality of bit line structures 140 and portions of the landing pad material layer 190P of FIGS. 8A through 8G around the plurality of landing pad holes 190H by using the cell hard mask pattern HMKC as an etching mask. The plurality of landing pads 190 may be separated from each other with recesses 190R therebetween. Referring to FIG. 9C, portions of each of the plurality of insulation fences 180 may also be removed by using the cell hard mask pattern HMKC as an etching mask.

The plurality of landing pads 190 may be arranged on the plurality of buried contacts 170 and may extend over the plurality of bit line structures 140. According to some embodiments, the plurality of landing pads 190 may extend over the plurality of bit lines 147. The plurality of landing pads 190 may be arranged on the plurality of buried contacts 170 to be electrically connected to the plurality of buried contacts 170, respectively. The plurality of landing pads 190 may be connected to the active regions 118 via the plurality of buried contacts 170, respectively. The plurality of landing pads 190 may constitute the plurality of landing pads LP of FIG. 1.

Each buried contact 170 may be between two adjacent bit line structures 140, and each landing pad 190 may extend from between the two adjacent bit line structures 140 to above one of the two adjacent bit line structures 140, wherein the two adjacent bit line structures 140 have the buried contact 170 therebetween.

A plurality of logic bit lines BLP, and a plurality of contact plugs CPE, CPF, and CPG respectively filling the plurality of contact holes CPHE, CPHF, and CPHG are formed by removing the portions of the landing pad material layer 190P around the plurality of contact holes CPHE, CPHF, and CPHG by using the logic hard mask pattern HMKP as an etch mask. The plurality of logic bit lines BLP may be a portion of the landing pad material layer 190P on the plurality of contact plugs CPE, CPF, and CPG that is at a higher level than the second vertical level LV2.

The plurality of contact plugs CPE, CPF, and CPG may include a plurality of first contact plugs CPE, a plurality of second contact plugs CPF, and a plurality of third contact plugs CPG. The plurality of third contact plugs CPG may include a plurality of gate line contact plugs CPG1 and a plurality of bit line contact plugs CPG2. The first contact plug CPE and the second contact plug CPF may be referred to as a word line contact plug CPE and a logic active region contact plug CPF, respectively.

The word line contact plug CPE may extend to the lower word line layer 120a by penetrating the filling insulation layer (including first and second filling insulation layers 172 and 174) covering a portion of the top surface of each word line 120, the insulation layer pattern (including first and second insulation layer patterns 112 and 114), the buried insulation layer 124, and the upper word line layer 120*b*.

Each word line contact plug CPE may have a plug extension PE. The plug extension PE may be a portion of the word line contact plug CPE that fills the hole extension HE. Due to the plug extension PE, a horizontal width and a horizontal cross-section of the upper portion of the word line contact plug CPE may be increased. The bottom surface of the plug extension PE may have a higher vertical level than the first vertical level LV1 of the top surface of the second metal conductive pattern 146. For example, the vertical level of the bottom surface of the plug extension PE may be higher than the first vertical level LV1 of the top surface of the second metal conductive pattern 146, and may be lower than the second vertical level LV2 of the top surface of the insulation capping line 148. In some embodiments, the vertical level of the bottom surface of the plug extension PE may be lower than a top surface of the first filling insulating layer 172.

The lateral surface of a portion of the word line contact plug CPE that is adjacent to the top surface of the lower word line layer 120*a* may be surrounded by the upper word line layer 120*b*. For example, the lateral surface of a portion of the word line contact plug CPE at a level corresponding to the upper word line layer 120*b*, namely, a level between the top surface and the bottom surface of the upper word line layer 120*b*, may be completely covered by the upper word line layer 120*b*.

The logic active region contact plug CPF may extend to the logic active region 117 by penetrating the filling insulation layer (including first and second filling insulation layers 172 and 174) and the insulation layer pattern (including first and second insulation layer patterns 112 and 114).

According to some embodiments, the third contact plugs CPG, namely, the gate line contact plug CPG1 and the bit line contact hole CPG2, may extend to the first metal conductive patterns 145 by penetrating the insulation capping lines 148 and the second metal conductive patterns 146. According to some other embodiments, the third contact plugs CPG, namely, the gate line contact plug CPG1 and the bit line contact plug CPG2, may extend to the second metal conductive patterns 146 by penetrating the insulation capping lines 148. For example, the gate line contact plug CPG1 may extent to a gate line 147P by penetrating an insulation capping line 148, and the bit line contact plug CPG2 may extend to a bit line 147 by penetrating an insulation capping line 148.

The plurality of landing pads 190, the plurality of logic bit lines BLP, the first contact plugs CPE, the second contact plugs CPF, and the third contact plugs CPG may be simultaneously formed using the same etching process using both the cell hard mask pattern HMKC and the logic hard mask pattern HMKP as etching masks.

Referring to FIGS. 10A through 10D, the semiconductor memory device 1 including a plurality of capacitor structures 200 may be formed by sequentially forming a plurality of lower electrodes 210, a capacitor dielectric layer 220, and an upper electrode 230 on the plurality of landing pads 190. The plurality of lower electrodes 210 may be electrically connected to the plurality of landing pads 190, respectively. The capacitor dielectric layer 220 may conformally cover the plurality of lower electrodes 210. The upper electrode 230 may cover the capacitor dielectric layer 220. The upper electrode 230 may face the plurality of lower electrodes 210 with the capacitor dielectric layer 220 between the upper electrode 230 and the plurality of lower electrodes 210. The capacitor dielectric layer 220 and the upper electrode 230 may be integrally formed to cover the plurality of lower electrodes 210 in a certain region, e.g., one memory cell region CR. The plurality of lower electrodes 210 may constitute the plurality of storage nodes SN illustrated in FIG. 1.

Each of the plurality of lower electrodes 210 may have, but is not limited to, a solid pillar shape having a circular horizontal cross-section. According to some embodiments, each of the plurality of lower electrodes 210 may have a cylindrical shape with a closed bottom. According to some embodiments, when viewed from the top down, the plurality of lower electrodes 210 may be arranged to zigzag in the first horizontal direction (X direction) or the second horizontal direction (Y direction) in a honeycomb pattern. According to some other embodiments, the plurality of lower electrodes 210 may be arranged in lines in the first horizontal direction (X direction) and the second horizontal direction (Y direction) in a matrix pattern. The plurality of lower electrodes 210 may include, for example, impurity-doped silicon, a metal such as tungsten or copper, or a conductive metal compound such as titanium nitride. Although not shown particularly, the semiconductor memory device 1 may further include at least one support pattern that contacts sidewalls of the plurality of lower electrodes 210.

The capacitor dielectric layer 220 may include, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti) O, Sr(Zr,Ti)O, or a combination thereof.

The upper electrode 230 may include, for example, doped silicon, Ru, RuO, Pt, PtO, Ir, IrO, SRO(SrRuO), BSRO((Ba, Sr)RuO), CRO(CaRuO), BaRuO, La(Sr,Co)O, Ti, TiN, W, WN, Ta, TaN, TiAlN, TiSiN, TaAlN, TaSiN, or a combination thereof.

Before the plurality of capacitor structures 200 are formed, insulation structures 195 filling the recesses 190R may be formed. According to some embodiments, each of the insulation structures 195 may include an interlayer insulation layer and an etch stop layer. For example, the interlayer insulation layer may include an oxide layer and the etch stop layer may include a nitride layer. Although the top surfaces of the insulation structures 195 is at the same level as the bottom surfaces of the plurality of lower electrodes 210 in FIGS. 10A and 10C, embodiments are not limited thereto. For example, the top surfaces of the insulation structures 195 may be at a higher level than the bottom surfaces of the plurality of lower electrodes 210, and the plurality of lower electrodes 210 may each extend inside the insulation structures 195 toward the substrate 110.

The plurality of logic bit lines BLP may be filled with a covering insulation layer 250 to be level with the plurality of capacitor structures 200. The covering insulation layer 250 may include, for example, an oxide layer or an ultra-low K (ULK) layer. The oxide layer may be a layer selected from a borophosphosilicate glass (BPSG) layer, a phosphosilicate glass (PSG) layer, a borosilicate glass (BSG) layer, an un-doped silicate glass (USG) layer, a tetra-ethyl-ortho-silicate (TEOS) layer, and a high density plasma (HDP) layer. The ULK layer may be a layer selected from, for example, a SiOC layer and a SiCOH layer, each having an ultra low dielectric constant K of about 2.2 to about 2.4.

The semiconductor memory device 1 includes the substrate 110 having the plurality of active regions 118 and the plurality of logic active regions 117, the plurality of gate dielectric layers 122, the plurality of word lines 120, and the plurality of buried insulation layers 124 sequentially formed within the plurality of word line trenches 120T traversing the plurality of active regions 118 within the substrate 110, the insulation layer pattern (including first and second insulation layer patterns 112 and 114) covering the device isolation layer 116, the plurality of active regions 118, and the plurality of buried insulation layers 124, the plurality of bit line structures 140 on the insulation layer pattern (including first and second insulation layer patterns 112 and 114, the plurality of insulation spacer structures 150 respectively covering respective both sidewalls of the plurality of bit line structures 140, the plurality of gate line structures 140P on the plurality of logic active regions 117, the plurality of gate insulation spacers 150P respectively covering respective both sidewalls of the plurality of gate line structures 140P, the plurality of buried contacts 170 filling lower portions of the spaces defined by the plurality of insulation fences 180 and the plurality of insulation spacer structures 150 and being connected to the plurality of active regions 118, the plurality of landing pads 190 filling upper portions of the spaces defined by the plurality of insulation fences 180 and the plurality of insulation spacer structures 150 and each extending to the upper portion of each bit line structure 140, and the plurality of capacitor structures 200 including the plurality of lower electrodes 210, the capacitor dielectric layer 220, and the upper electrode 230, the plurality of capacitor structures 200 being connected to the plurality of landing pads 190.

The plurality of insulation fences 180 may be arranged apart from each other between every two adjacent insulation spacer structures 150 among the plurality of insulation spacer structures 150, which respectively cover the sidewalls of the plurality of bit line structures 140, in the second horizontal direction (Y direction). Each of the plurality of insulation fences 180 may extend from between the plurality of buried contacts 170 to between the plurality of landing pads 190.

The semiconductor memory device 1 may further include the word line contact plug CPE, the logic active region contact plug CPF, the gate line contact plug CPG1, and the bit line contact plug CPG2. The word line contact plug CPE, the logic active region contact plug CPF, the gate line contact plug CPG1, and the bit line contact plug CPG2 may be formed of the same material.

FIGS. 10A through 10G illustrate one word line contact plug CPE, one gate line contact plug CPG1, and one bit line contact plug CPG2 and two logic active region contact plugs CPF. However, embodiments are not limited thereto. For example, the semiconductor memory device 1 may include a plurality of word line contact plugs CPE, a plurality of gate line contact plugs CPG1, a plurality of bit line contact plugs CPG2, and a plurality of logic active region contact plugs CPF to correspond to the plurality of word lines 120, the plurality of gate lines 147P, the plurality of bit lines 147, and the plurality of logic active regions 117.

Each word line contact plug CPE may extend to the lower word line layer 120a by penetrating the filling insulation layer (including first and second filling insulation layers 172 and 174), the insulation layer pattern (including first and second insulation layer patterns 112 and 114), the buried insulation layer 124, and the upper word line layer 120b. Each logic active region contact plug CPF may be connected to the logic active region 117 by penetrating the filling insulation layer (including first and second filling insulation layers 172 and 174) and the insulation layer pattern (including first and second insulation layer patterns 112 and 114).

Each gate line contact plug CPG1 may be connected to a gate line 147P by penetrating an insulation capping line 148, and each bit line contact plug CPG2 may extend to a bit line

147 by penetrating an insulation capping line 148. According to some embodiments, each gate line contact plug CPG1 and each bit line contact plug CPG2 may be connected to the first metal conductive patterns 145 by penetrating the insulation capping lines 148 and the second metal conductive patterns 146. According to some other embodiments, each gate line contact plug CPG1 and each bit line contact plug CPG2 may be connected to the second metal conductive patterns 146 by penetrating the insulation capping lines 148.

The plurality of logic bit lines BLP may be arranged on the insulation capping lines 148 and the filling insulation layers (including first and second filling insulation layers 172 and 174). Each of the word line contact plug CPE, the logic active region contact plug CPF, the gate line contact plug CPG1, and the bit line contact plug CPG2 may be connected to at least one of the plurality of logic bit lines BLP. According to some embodiments, the word line contact plug CPE, the logic active region contact plug CPF, the gate line contact plug CPG1, and the bit line contact plug CPG2 may include the same material as that material included in the plurality of logic bit lines BLP and may be integrally formed with the plurality of logic bit lines BLP. According to some embodiments, the word line contact plug CPE, the logic active region contact plug CPF, the gate line contact plug CPG1, and the bit line contact plug CPG2 may include the same material as that material included in the plurality of landing pads 190.

Because the word line contact plug CPE of the semiconductor memory device 1 according to an example embodiment of the inventive concept includes, as an upper portion thereof, the plug extension PE having a greater horizontal width and a greater horizontal area than a lower portion thereof, electrical connection between the word line contact plug CPE and the logic bit line BLP may provide improved reliability. While the hole extension HE is being formed to form the plug extension PE, the bottom surface of the word line contact hole CPHE may be lowered, and thus a not open problem in which the word line 120 is not exposed at the bottom of the word line contact hole CPHE may be prevented.

Moreover, because the word line contact hole CPHE extends to the lower word line layer 120a, the word line contact plug CPE may contact both the upper word line layer 120b and the lower word line layer 120a and accordingly may be electrically connected to the upper word line layer 120b and the lower word line layer 120a. Therefore, the reliability of electrical connection between the word line contact plug CPE and the word line 120 may improve.

Figure 11:
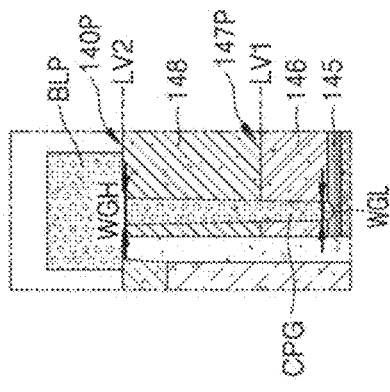
FIG. 11 is a cross-sectional view for comparing the cross-sections of contact plugs of semiconductor memory devices, according to example embodiments of the inventive concept.
Figure 11:
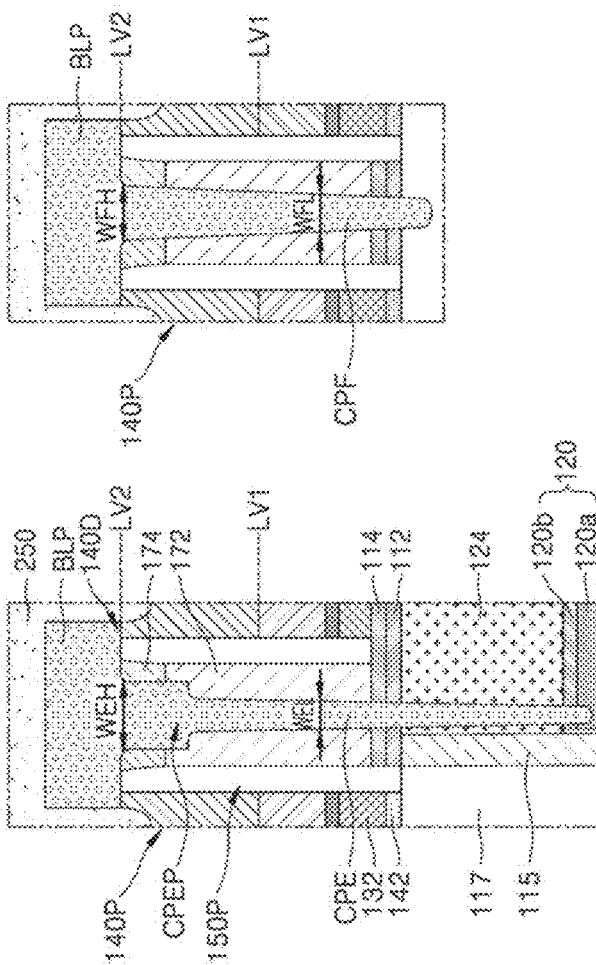

FIG. 11 is a cross-sectional view for comparing the cross-sections of contact plugs of semiconductor memory devices according to embodiments of the inventive concept.

Referring to FIG. 11 and FIGS. 10A through 10G, the semiconductor memory device 1 may include the first contact plug CPE, the second contact plug CPF, and the third contact plug CPG. The first contact plug CPE and the second contact plug CPF may be referred to as a word line contact plug CPE and a logic active region contact plug CPF, respectively. The third contact plug CPG may include the gate line contact plugs CPG1 and the bit line contact plug CPG2. The gate line contact plug CPG1 and the bit line contact plug CPG2 are substantially the same as each other in terms of shape except that they are connected to the gate line 147P and the bit line 147, respectively, or FIG. 11 illustrates the cross-section of the bit line contact plug CPG2 to describe the third contact plug CPG and does not illustrate and describe the gate line contact plug CPG1.

The word line contact plug CPE may extend from the logic bit line BLP to the lower word line layer 120a by penetrating the filling insulation layer (including first and second filling insulation layers 172 and 174) covering a portion of the top surface of each word line 120, the insulation layer pattern (including first and second insulation layer patterns 112 and 114), the buried insulation layer 124, and the upper word line layer 120b.

The word line contact plug CPE may have a plug extension PE. Due to the plug extension PE, a horizontal width and a horizontal cross-section of the upper portion of the word line contact plug CPE may be increased. The bottom surface of the plug extension PE may have a higher vertical level than the first vertical level LV1 of the top surface of the second metal conductive pattern 146. For example, the vertical level of the bottom surface of the plug extension PE may be higher than the first vertical level LV1 of the top surface of the second metal conductive pattern 146, and may be lower than the second vertical level LV2 of the top surface of the insulation capping line 148.

The lateral surface of a portion of the word line contact plug CPE that is adjacent to the top surface of the lower word line layer 120a may be entirely surrounded by the upper word line layer 120b. For example, the lateral surface of a portion of the word line contact plug CPE at a level corresponding to the upper word line layer 120b, namely, a level between the top surface and the bottom surface of the upper word line layer 120b, may be completely covered by the upper word line layer 120b. For example, the upper word line layer 120b may contact the lateral surface of the portion of the word line contact plug CPE that is adjacent to the top surface of the lower word line layer 120a, extending around the circumference of the word line contact plug CPE.

The logic active region contact plug CPF may extend from the logic bit line BLP to the logic active region 117 by penetrating the filling insulation layer (including first and second filling insulation layers 172 and 174) and the insulation layer pattern (including first and second insulation layer patterns 112 and 114).

The third contact plug CPG, namely, the gate line contact plug CPG1, may extend to a gate line 147P by penetrating an insulation capping line 148, and the bit line contact plug CPG2 may extend to a bit line 147 by penetrating an insulation capping line 148. According to some embodiments, the third contact plug CPG, namely, the gate line contact plug CPG1 and the bit line contact plug CPG2, may extend from the logic bit line BLP to the first metal conductive patterns 145 by penetrating the insulation capping lines 148 and the second metal conductive patterns 146. According to some other embodiments, the third contact plug CPG, namely, the gate line contact plug CPG1 and the bit line contact plug CPG2, may extend from the logic bit line BLP to the second metal conductive patterns 146 by penetrating the insulation capping lines 148.

A ratio WEH/WEL of a horizontal width WEH of the word line contact plug CPE at the second vertical level LV2 to a horizontal width WEL of the word line contact plug CPE at the first vertical level LV1 may be greater than each of a ratio WFH/WFL of a horizontal width WFH of the logic active region contact plug CPF at the second vertical level LV2 to a horizontal width WFL of the logic active region contact plug CPF at the first vertical level LV1 and a ratio WGH/WGL of a horizontal width WGH of the third contact plug CPG, namely, the gate line contact plug CPG1 and the bit line contact plug CPG2, at the second vertical level LV2 to a horizontal width WGL of the third contact plug CPG, namely, the gate line contact plug CPG1 and the bit line contact plug CPG2, at the first vertical level LV1.

According to some embodiments, an extension length of the word line contact plug CPE from the logic bit line BLP to the substrate 110 may be greater than that of the logic active region contact plug CPF, and an extension length of the logic active region contact plug CPF may be greater than that of the third contact plug CPG, namely, the gate line contact plug CPG1 and the bit line contact plug CPG2. For example, the word line contact plug CPE may extend to a lower vertical level than the logic active region contact plug CPF, and the logic active region contact plug CPF may extend to a lower vertical level than the gate line contact plug CPG1 and the bit line contact plug CPG2.

According to some embodiments, the horizontal width WFL of the logic active region contact plug CPF at the first vertical level LV1 may be greater than the horizontal width WEL of the word line contact plug CPE at the first vertical level LV1, and the horizontal width WEL of the word line contact plug CPE at the first vertical level LV1 may be greater than the horizontal width WGL of the third contact plug CPG, namely, the gate line contact plug CPG1 and the bit line contact plug CPG2, at the first vertical level LV1. However, embodiments are not limited thereto.

While the inventive concept has been particularly shown and described with reference to embodiments thereof, it will be understood that various changes in form and details may be made therein without departing from the spirit and scope of the following claims.

What is claimed is:

1. A semiconductor device comprising:
a substrate having a cell region, a peripheral region, and an interface region between the cell region and the peripheral region, the interface region including a device isolation layer;
a cell gate structure buried in the substrate of the cell region in a first direction that is parallel to a top surface of the substrate, and extending in the device isolation layer of the interface region of the substrate, the cell gate structure including a conductive layer, and a cell gate capping layer that is disposed on the conductive layer;
a bit line structure arranged on the cell region of the substrate in a second direction that is perpendicular to the first direction and parallel to the top surface of the substrate, and extending on the device isolation layer of the interface region of the substrate;
a peripheral gate structure on the peripheral region of the substrate;
an insulation layer arranged on the device isolation layer of the interface region and the peripheral region of the substrate, and disposed between the bit line structure and the peripheral gate structure;
a contact plug including a first portion and a second portion that is disposed on the first portion on the interface region of the substrate; and
a plurality of wirings on the contact plug,
wherein at least one of the plurality of wirings is in contact with the contact plug and vertically overlaps the contact plug,
wherein the contact plug is in contact with the conductive layer of the cell gate structure, and
wherein a first horizontal width of the first portion of the contact plug is different from a second horizontal width of the second portion of the contact plug.

2. The semiconductor device of claim 1, wherein the insulation layer includes a first insulation layer arranged on the device isolation layer of the interface region of the substrate, and a second insulation layer on the first insulation layer.

3. The semiconductor device of claim 2, wherein the first insulation layer includes silicon oxide, and the second insulation layer includes silicon nitride.

4. The semiconductor device of claim 2, wherein the first portion of the contact plug is disposed in the first insulation layer, and the second portion of the contact plug is disposed in the second insulation layer.

5. The semiconductor device of claim 1, further comprising:

a covering insulation layer on the bit line structure and the plurality of wirings, the covering insulation layer filling a space between the plurality of wirings.

6. The semiconductor device of claim 5, wherein the bit line structure includes a bit line pattern, and a bit line capping layer that is disposed on the bit line pattern, and wherein the covering insulation layer extends in the bit line capping layer.

7. The semiconductor device of claim 1, wherein the conductive layer includes a titanium nitride layer.

8. The semiconductor device of claim 7, wherein the contact plug is in contact with the titanium nitride layer of the conductive layer.

9. The semiconductor device of claim 1, wherein the bit line structure includes a bit line pattern, and a bit line capping layer that is disposed on the bit line pattern, and wherein the bit line capping layer has a recess extending into an interior of the bit line capping layer from an upper surface of the bit line capping layer.

10. The semiconductor device of claim 9, further comprising:

a covering insulation layer on the plurality of wirings, the covering insulation layer filling a space between the plurality of wirings and the recess.

11. The semiconductor device of claim 9, wherein the recess overlaps a space between the plurality of wirings in a third direction that is perpendicular to the top surface of the substrate.

12. A semiconductor device comprising:

a substrate having a cell region, a peripheral region, and an interface region between the cell region and the peripheral region, the cell region including a cell active region, the peripheral region including a logic active region, and the interface region including a device isolation layer;

a cell gate structure buried in the substrate of the cell region in a first direction that is parallel to a top surface of the substrate, and extending in the device isolation layer of the interface region of the substrate, the cell gate structure including a gate dielectric layer that is disposed in the substrate, a titanium nitride layer that is disposed on the gate dielectric layer, and a cell gate capping layer that is disposed on the titanium nitride layer;

a bit line structure arranged on the cell region of the substrate in a second direction that is perpendicular to the first direction and parallel to the top surface of the substrate, and extending on the device isolation layer of the interface region of the substrate, the bit line structure including a bit line pattern, and a bit line capping layer that is disposed on the bit line pattern;

a peripheral gate structure on the peripheral region of the substrate, the peripheral gate structure including a peripheral gate pattern and a peripheral gate capping layer that is disposed on the peripheral gate pattern;

an insulation layer disposed between the bit line structure and the peripheral gate structure on the interface region and the peripheral region of the substrate;

a first contact plug on the interface region of the substrate; and a first wiring contacting the first contact plug and vertically overlapping the first contact plug, wherein the first contact plug is in contact with the titanium nitride layer of the cell gate structure.

13. The semiconductor device of claim 12, wherein the insulation layer includes a first insulation layer and a second insulation layer that is disposed on the first insulation layer, wherein the first contact plug includes a first portion in the first insulation layer and a second portion in the second insulation layer that is disposed on the first portion, and wherein a first horizontal width of the first portion of the first contact plug is different from a second horizontal width of the second portion of the first contact plug.

14. The semiconductor device of claim 13, wherein an etch rate of the second insulation layer differs from an etch rate of the first insulation layer.

15. The semiconductor device of claim 12, further comprising:

a second contact plug passing through the insulation layer, and connected to the logic active region of the peripheral region of the substrate;

a third contact plug passing through the bit line capping layer of the bit line structure, and connected to the bit line pattern of the bit line structure; and a fourth contact plug passing through the peripheral gate capping layer of the peripheral gate structure, and connected to the peripheral gate pattern of the peripheral gate structure, wherein a vertical length of the first contact plug is greater than a vertical length of each of the second to fourth contact plugs in a third direction that is perpendicular to the top surface of the substrate.

16. The semiconductor device of claim 15, wherein a top surface of the insulation layer is substantially coplanar with a top surface of at least one of the bit line structure, the first contact plug, the second contact plug, the third contact plug, or the fourth contact plug.

17. The semiconductor device of claim 16, further comprising:

second to fourth wirings, wherein the first to fourth wirings are respectively on the first to fourth contact plugs.

18. The semiconductor device of claim 17, further comprising:

a covering insulation layer on the first to fourth wirings, the covering insulation layer filling a space between the first to fourth wirings, wherein the covering insulation layer extends in the bit line capping layer.

19. The semiconductor device of claim 17, wherein the bit line capping layer has a recess extending into an interior of the bit line capping layer from an upper surface of the bit line capping layer, and wherein the recess overlaps a space between the first to fourth wirings in the third direction that is perpendicular to the top surface of the substrate.

20. The semiconductor device of claim 12, further comprising:

a buried contact connected to the cell active region of the
cell region of the substrate; and a landing pad arranged on the buried contact and extending over the bit line structure, wherein the first contact plug and the landing pad include 5
the same material.

* * * * *